(12) United States Patent
Izumitani et al.

(10) Patent No.: US 6,727,590 B2
(45) Date of Patent: Apr. 27, 2004

(54) SEMICONDUCTOR DEVICE WITH INTERNAL BONDING PAD

(75) Inventors: Junko Izumitani, Tokyo (JP); Hiroki Takewaka, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/136,533

(22) Filed: May 2, 2002

(65) Prior Publication Data

US 2003/0080428 A1 May 1, 2003

(30) Foreign Application Priority Data

Nov. 1, 2001 (JP) ........................................ 2001-336202

(51) Int. Cl.$^7$ .................... H01L 23/48; H01L 23/52; H01L 29/40
(52) U.S. Cl. .................. 257/758; 257/700; 257/701; 257/751; 257/759; 257/784; 257/211; 257/208
(58) Field of Search ................................. 257/758, 208, 257/211, 700, 701, 759, 784, 751

(56) References Cited

U.S. PATENT DOCUMENTS

| 6,016,000 A | * | 1/2000 | Moslehi | ........................ 257/522 |
| 2002/0005583 A1 | * | 1/2002 | Harada et al. | ............... 257/758 |

FOREIGN PATENT DOCUMENTS

| EP | 0 913 863 | 5/1999 |
| JP | 11-135506 | 5/1999 |
| JP | 2000-012604 | 1/2000 |
| JP | 2001-015516 | 1/2001 |

* cited by examiner

*Primary Examiner*—Alexander Oscar Williams
(74) *Attorney, Agent, or Firm*—Oblon, Spivak, McClelland, Maier & Neustadt, P.C.

(57) ABSTRACT

A semiconductor device has a multilayer interconnection structure in which a plurality of interconnection layers is formed in an insulating film. The multilayer interconnection structure has a first metal film made of a first material and functioning as a first interconnection belonging to an interconnection layer other than an uppermost interconnection layer, a second metal film made of a second material and functioning as a second interconnection belonging to the uppermost interconnection layer, a third metal film made of the first material and belonging to an interconnection layer other than the uppermost interconnection layer and functioning as a bonding pad, an opening formed in the insulating film and having its bottom defined by the third metal film, and a bonding wire connected to the third metal film through the opening. The second material has a lower resistance and is more susceptible to oxidation than the first material.

8 Claims, 35 Drawing Sheets

F I G. 18
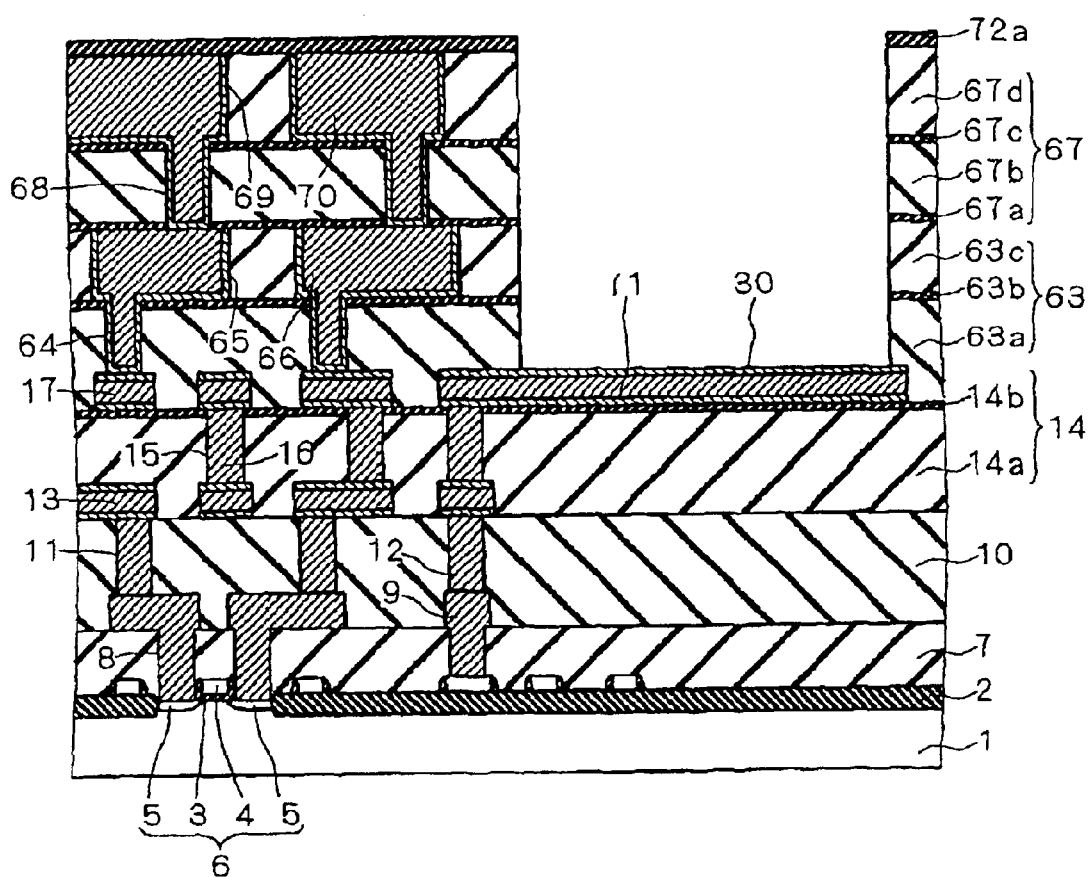

SEMICONDUCTOR DEVICE WITH INTERNAL BONDING PAD

BACKGROUND OF THE INVENTION

1. Field of the Invention

The present invention relates to semiconductor devices, and particularly to a semiconductor device having a multi-layer interconnection structure with aluminum (Al) interconnections in lower layers and copper (Cu) interconnections in upper layers.

2. Description of the Background Art

FIG. 26 is a cross-sectional view showing the structure of a conventional semiconductor device using aluminum interconnections. An element isolation insulating film 102 formed of a silicon oxide film ($SiO_2$) is partially formed on a silicon (Si) substrate 101. Semiconductor elements such as MOSFETs 106 are formed in an element formation region defined by the element isolation insulating film 102. Each MOSFET 106 has a gate electrode 104 formed on an upper surface of the silicon substrate 101 with a gate insulating film 103 interposed therebetween, and a pair of source/drain regions 105 formed in the upper surface of the silicon substrate 101 with a channel formation region under the gate electrode 104 being interposed between the source/drain regions 105. While FIG. 26 shows gate electrodes 104 formed on the element isolation insulating film 102, the gate electrodes 104 of MOSFETs which are present in the depths of, or on this side of the paper extend on the element isolation insulating film 102.

An underlying insulating film 107 is formed all over the silicon substrate 101 to cover the MOSFETs 106 and the element isolation insulating film 102. The underlying insulating film 107 is formed of a silicon oxide film or a silicon oxide film implanted with an impurity element such as phosphorus (P) or boron (B). Contact holes 108 are formed in the underlying insulating film 107 and connected to the MOSFETs 106. First-layer interconnections 109, made of tungsten (W), are formed partially on the underlying insulating film 107. The first-layer interconnections 109, which are local interconnections, are short in length. The first-layer interconnections 109 are connected to the MOSFETs 106 through the tungsten which fills the contact holes 108.

A first interlayer insulating film 110 is formed on the underlying insulating film 107 to cover the first-layer interconnections 109. The first interlayer insulating film 110 is formed of a silicon oxide film or the like. Via holes 111 are formed in the first interlayer insulating film 110 and connected to the first-layer interconnections 109. The via holes 111 are filled with via plugs 112 made of tungsten or the like. Second-layer interconnections 113, made of an aluminum alloy such as Al—Cu, Al—Si—Cu, Al—Cu—Ti, etc., are partially formed on the first interlayer insulating film 110. The second-layer interconnections 113, which are short-distance interconnections, are relatively short in length. The second-layer interconnections 113 are connected to the first-layer interconnections 109 through the via plugs 112.

A second interlayer insulating film 114 is formed on the first interlayer insulating film 110 to cover the second-layer interconnections 113. The second interlayer insulating film 114 is formed of a silicon oxide film or the like. Via holes 115 are formed in the second interlayer insulating film 114 and connected to the second-layer interconnections 113. The via holes 115 are filled with via plugs 116 made of tungsten or the like. Third-layer interconnections 117, made of an aluminum alloy, are partially formed on the second interlayer insulating film 114. The third-layer interconnections 117, which are short-distance interconnections, are relatively short in length. The third-layer interconnections 117 are connected to the second-layer interconnections 113 through the via plugs 116.

A third interlayer insulating film 118 is formed on the second interlayer insulating film 114 to cover the third-layer interconnections 117. The third interlayer insulating film 118 is formed of a silicon oxide film or the like. Via holes 119 are formed in the third interlayer insulating film 118 and connected to the third-layer interconnections 117. The via holes 119 are filled with via plugs 120 made of tungsten or the like. Fourth-layer interconnections 121, made of an aluminum alloy, are partially formed on the third interlayer insulating film 118. The fourth-layer interconnections 121, which are long-distance interconnections or power-supply lines, are relatively long in length. Also, the fourth-layer interconnections 121 are thicker than the first- to third-layer interconnections 109, 113 and 117 in order to reduce the interconnection resistance and to increase the permissible current density. The fourth-layer interconnections 121 are connected to the third-layer interconnections 117 through the via plugs 120.

A fourth interlayer insulating film 122 is formed on the third interlayer insulating film 118 to cover the fourth-layer interconnections 121. The fourth interlayer insulating film 122 is formed of a silicon oxide film or the like. Via holes 123 are formed in the fourth interlayer insulating film 122 and connected to the fourth-layer interconnections 121. The via holes 123 are filled with via plugs 124 made of tungsten or the like. A fifth-layer interconnection 125 and a bonding pad 126, both made of an aluminum alloy, are formed partially on the fourth interlayer insulating film 122. The fifth-layer interconnection 125, which is a long-distance interconnection or a power-supply line, is relatively long in length. Also, the fifth-layer interconnection 125 is thicker than the first- to third-layer interconnections 109, 113 and 117 in order to reduce the interconnection resistance and to increase the permissible current density. The fifth-layer interconnection 125 and the bonding pad 126 are connected to the fourth-layer interconnections 121 through the via plugs 124.

A protective insulating film 127 is formed on the fourth interlayer insulating film 122 to cover the fifth-layer interconnection 125 and the bonding pad 126. The protective insulating film 127 is formed of a silicon oxide film, a silicon nitride film ($Si_3N_4$), a silicon oxynitride film (SiON), or a composite film thereof. A buffer coat film 128 is formed on the protective insulating film 127 when required. The buffer coat film 128 is made of polyimide or the like.

An opening 129, having its bottom defined by the bonding pad 126, is formed in part of the protective insulating film 127 and the buffer coat film 128. A bonding wire 130 is inserted in the opening 129 and bonded to the bonding pad 126. The bonding wire 130 is made of gold (Au), aluminum, or the like. A metal layer 131 is formed at the interface between the bonding wire 130 and the bonding pad 126. When the bonding wire 130 and the bonding pad 126 are made of different materials, the metal layer 131 is a layer of a compound of the material metal of the bonding wire 130 and that of the bonding pad 126. When the two are made of the same material, the metal layer 131 is an inter-diffusion layer of the material metals.

The buffer coat film 128 and the bonding wire 130 are sealed with a molding resin 132.

FIGS. 27 to 35 are cross-sectional views showing a sequence of process steps for manufacturing the semiconductor device shown in FIG. 26. First, referring to FIG. 27, the element isolation insulating film 102 is formed in the element isolation region of the silicon substrate 101 by a LOCOS (Local Oxidation of Silicon) isolation or trench isolation process. Next, the MOSFETs 106 are formed in the element formation region of the silicon substrate 101 by known processes such as CVD (Chemical Vapor Deposition), anisotropic dry etching, ion implantation, etc. Next, the underlying insulating film 107 is formed by CVD over the entire surface.

Next, referring to FIG. 28, the contact holes 108 are formed in the underlying insulating film 107 by photolithography and anisotropic dry etching. Next, a barrier metal 109a, composed of a stacked film of a titanium (Ti) film and a titanium nitride (TiN) film, is formed over the entire surface by PVD (Physical Vapor Deposition). The formation of the barrier metal 109a offers good ohmic contact with the silicon. Next, a tungsten film 109b is formed all over the surface by thermal CVD using reduction of tungsten hexafluoride ($WF_6$) and hydrogen ($H_2$). Setting the temperature at about 375 to 450° C. during the film formation provides the tungsten film 109b with good step coverage. As a result the contact holes 108 can be easily filled with the tungsten film 109b even when they have a high aspect ratio. Also, the titanium nitride film used as the barrier metal 109a has the effect of preventing the silicon substrate 101 from being damaged by tungsten hexafluoride during the formation of the tungsten film 109b.

Next, the barrier metal 109a and the tungsten film 109b are patterned by photolithography and anisotropic dry etching to form the first-layer interconnections 109. While the tungsten interconnections have interconnection resistance about three times higher than that of the aluminum interconnections, they can be formed by a simpler formation process since they do not need formation of contact plugs. The tungsten interconnections are hence generally used as short interconnections (local interconnections etc.).

Next, the first interlayer insulating film 110 is formed all over the surface to cover the first-layer interconnections 109. The first interlayer insulating film 110, which underlies the second-layer interconnections 113, requires a sufficient degree of flatness. Accordingly, the first interlayer insulating film 110 is formed through a process of forming all over the surface a silicon oxide film thicker than the target thickness of the first interlayer insulating film 110 by CVD using high-density plasma etc. and a surface planarization process of polishing the surface of the silicon oxide film for a given thickness by chemical mechanical polishing (CMP) using a potassium-hydroxide (KOH)-or ammonia-water ($NH_4OH$)-based silica abrasive. Alternatively, the first interlayer insulating film 110 is formed through a process of forming all over the surface a silicon oxide film thinner than the target thickness of the first interlayer insulating film 110 by CVD and a process of forming an SOG (Spin On Glass) film on the silicon oxide film by spin coating.

Next, referring to FIG. 29, the via holes 111 are formed in the first interlayer insulating film 110 by photolithography and anisotropic dry etching. Next, a foundation film 112a, a stacked film of a titanium film and a titanium nitride film, is formed all over the surface by PVD or CVD. The formation of the foundation film 112a offers good contact with the first-layer interconnections 109. Next, a tungsten film 112b with good step coverage is formed all over the surface by a process similar to that used to form the tungsten film 109b. Next, the tungsten film 112b and the foundation film 112a are polished until the top surface of the first interlayer insulating film 110 is exposed, by CMP using a hydrogen-peroxide ($H_2O_2$)-based alumina abrasive or silica abrasive. The foundation film 112a and the tungsten film 112b in the via holes 111 thus remain unpolished as the via plugs 112.

Next, referring to FIG. 30, a foundation film 113a, e.g. formed of a titanium film, a titanium nitride film, or a stacked film thereof, is formed all over the surface by PVD. Next, an aluminum alloy film 113b, e.g. made of Al—Cu, Al—Si—Cu, Al—Cu—Ti, is formed all over the surface by PVD. Next, an antireflection film 113c, made of titanium nitride, is formed all over the surface by PVD. Next, these films 113a to 113c are patterned by photolithography and anisotropic dry etching to form the second-layer interconnections 113. Next, the second interlayer insulating film 114 with good surface flatness is formed all over the surface by a process similar to that used to form the first interlayer insulating film 110.

Next, referring to FIG. 31, by process steps similar to those shown in FIGS. 29 and 30, (a) the via holes 115 are formed in the second interlayer insulating film 114, (b) a foundation film 116a and a tungsten film 116b are formed all over the surface, (c) these films 116a and 116b are polished to form the via plugs 116, (d) a foundation film 117a, an aluminum alloy film 117b, and an antireflection film 117c are formed all over the surface, (e) these films 117a to 117c are patterned to form the third-layer interconnections 117, and (f) the third interlayer insulating film 118 is formed all over the surface.

Next, referring to FIG. 32, by process steps similar to those shown in FIGS. 29 and 30, (a) the via holes 119 are formed in the third interlayer insulating film 118, (b) a foundation film 120a and a tungsten film 120b are formed all over the surface, (c) these films 120a and 120b are polished to form, the via plugs 120, (d) a foundation film 121a, an aluminum alloy film 121b, and an antireflection film 121c are formed all over the surface, (e) these films 121a to 121c are patterned to form the fourth-layer interconnections 121, and (f) the fourth interlayer insulating film 122 is formed all over the surface.

Next, referring to FIG. 33, by process steps similar to those shown in FIGS. 29 and 30, (a) the via holes 123 are formed in the fourth interlayer insulating film 122, (b) a foundation film 124a and a tungsten film 124b are formed all over the surface, (c) these films 124a and 124b are polished to form the via plugs 124, (d) a foundation film 125a, an aluminum alloy film 125b, and an antireflection film 125c are formed all over the surface, and (e) these films 125a to 125c are patterned to form the fifth-layer interconnection 125. The bonding pad 126, composed of a foundation film 126a, an aluminum alloy film 126b, and an antireflection film 126c, is also formed during the patterning of the films 125a to 125c.

Next, referring to FIG. 34, the protective insulating film 127 is formed by CVD all over the surface. Next, the buffer coat film 128 is formed by CVD all over the surface. Next, the buffer coat film 128 and the protective insulating film 127 are partially removed by photolithography and anisotropic dry etching to form the opening 129. At this time, the antireflection film 126c of the bonding pad 126 is also removed to expose the top surface of the aluminum alloy film 126b. Next, the semiconductor wafer is separated by dicing into individual chips and the chips are bonded on the back to leadframes or mount boards (neither is shown) with resin or solder.

Next, referring to FIG. 35, the bonding wire 130 is inserted in the opening 129 and bonded to the aluminum alloy film 126b of the bonding pad 126 by an ultrasonic or thermocompression process. At this time the metal layer 131 is formed at the interface between the bonding wire 130 and the bonding pad 126.

Finally, the entirety shown in FIG. 35 is sealed with the molding resin 132 to obtain the structure shown in FIG. 26.

Recently, for the purpose of realizing high speed operation and high performance of devices, interconnections chiefly made of copper (copper interconnections) are used in place of conventional interconnections chiefly made of aluminum (aluminum interconnections), so as to reduce the interconnection resistance and increase the permissible current density; the copper interconnections have lower resistance and higher reliability than the aluminum interconnections.

FIG. 36 is a cross-sectional view showing the structure of a conventional semiconductor device using copper interconnections. An element isolation insulating film 102 is formed in the element isolation region of the silicon substrate 101 and MOSFETs 106 are formed in the element formation region.

An underlying insulating film 151 is formed on the entire surface of the silicon substrate 101 to cover the MOSFETs 106 and the element isolation insulating film 102. In the underlying insulating film 151, contact holes 152 are formed and connected to the MOSFETs 106 and interconnection trenches 153 are formed and connected to the contact holes 152. First-layer interconnections 154, made of tungsten, are formed to fill the interconnection trenches 153. The first-layer interconnections 154, which are local interconnections, are short in length. The first-layer interconnections 154 are connected to the MOSFETs 106 through the tungsten which fills the contact holes 152.

A first interlayer insulating film 155 is formed on the underlying insulating film 151. In the first interlayer insulating film 155, via holes 156 are formed and connected to the first-layer interconnections 154 and interconnection trenches 157 are formed and connected to the via holes 156. Second-layer interconnections 158, made of copper, are formed to fill the interconnection trenches 157. The second-layer interconnections 158, which are short-distance interconnections, are relatively short in length. The second-layer interconnections 158 are connected to the first-layer interconnections 154 through the copper which fills the via holes 156.

A second interlayer insulating film 159 is formed on the first interlayer insulating film 155. In the second interlayer insulating film 159, via holes 160 are formed and connected to the second-layer interconnections 158 and interconnection trenches 161 are formed and connected to the via holes 160. Third-layer interconnections 162, made of copper, are formed to fill the interconnection trenches 161. The third-layer interconnections 162, which are short-distance interconnections, are relatively short in length. The third-layer interconnections 162 are connected to the second-layer interconnections 158 through the copper in the via holes 160.

A third interlayer insulating film 163 is formed on the second interlayer insulating film 159. In the third interlayer insulating film 163, via holes 164 are formed and connected to the third-layer interconnections 162 and interconnection trenches 165 are formed and connected to the via holes 164. Fourth-layer interconnections 166, made of copper, are formed to fill the interconnection trenches 165. The fourth-layer interconnections 166, which are long-distance interconnections or power-supply lines, are relatively long in length. Also, the fourth-layer interconnections 166 are thicker than the first- to third-layer interconnections 154, 158 and 162 in order to reduce the interconnection resistance and increase the permissible current density. The fourth-layer interconnections 166 are connected to the third-layer interconnections 162 through the copper in the via holes 164.

A fourth interlayer insulating film 167 is formed on the third interlayer insulating film 163. In the fourth interlayer insulating film 167, via holes 168 are formed and connected to the fourth-layer interconnections 166 and an interconnection trench 169L and an electrode trench 169P are formed and connected to the via holes 168. A fifth-layer interconnection 170, made of copper, is formed to fill the interconnection trench 169L. The fifth-layer interconnection 170, which is a long-distance interconnection or a power-supply line, is relatively long in length. Also, the fifth-layer interconnection 170 is thicker than the first- to third-layer interconnections 154, 158 and 162 in order to reduce the interconnection resistance and increase the permissible current density. Further, a bonding pad 171, made of copper, is formed to fill the electrode trench 169P. The fifth-layer interconnection 170 and the bonding pad 171 are connected to the fourth-layer interconnections 166 through the copper in the via holes 168.

A protective insulating film 172 is formed on the fourth interlayer insulating film 167. The protective insulating film 172 is formed of a silicon oxide film, a silicon nitride film, a silicon oxynitride film, or a composite film thereof. A buffer coat film 173 is formed on the protective insulating film 172 when required. The buffer coat film 173 is made of polyimide, for example.

An opening 174, having its bottom defined by the bonding pad 171, is formed in part of the protective insulating film 172 and the buffer coat film 173. A bonding wire 175 is inserted in the opening 174 and bonded to the bonding pad 171. The bonding wire 175 is made of gold, aluminum, or the like. A metal layer 176 is formed at the interface between the bonding wire 175 and the bonding pad 171. When the bonding wire 175 and the bonding pad 171 are made of different materials, the metal layer 176 is a layer of a compound of the material metal of the bonding wire 175 and that of the bonding pad 171. When the two are made of the same material, the metal layer 176 is an inter-diffusion layer of the material metals.

The buffer coat film 173 and the bonding wire 175 are sealed with a molding resin 177.

FIGS. 37 to 48 are cross-sectional views showing a sequence of process steps for manufacturing the semiconductor device shown in FIG. 36. First, referring to FIG. 37, the element isolation insulating film 102 and the MOSFETs 106 are formed by a process similar to that shown in FIG. 27. Next, a silicon oxide film 151*a* (which may be implanted with an impurity element such as phosphorus or boron), a silicon nitride film 151*b*, and a silicon oxide film 151*c* are deposited in this order all over the surface by thermal CVD or plasma CVD, so as to form the underlying insulating film 151.

Next, referring to FIG. 38, the interconnection trenches 153 are formed in the silicon oxide film 151*c* by photolithography and anisotropic dry etching. The anisotropic dry etching is carried out under such conditions that silicon oxide film is easily etched and silicon nitride film is not easily etched so that the silicon nitride film 151*b* can function as an etching stopper. Next, the contact holes 152 are formed in the underlying insulating film 151 by photolithography and anisotropic dry etching.

Next, referring to FIG. 39, a barrier metal 154a, formed of a stacked film of a titanium film and a titanium nitride film, is formed over the entire surface by PVD or CVD. The formation of the barrier metal 154a offers good ohmic contact with silicon. Next, a tungsten film 154b is formed all over the surface by thermal CVD using reduction of tungsten hexafluoride and hydrogen.

Next, referring to FIG. 40, the tungsten film 154b and the barrier metal 154a are polished by CMP using a hydrogen-peroxide-based alumina abrasive until the top surface of the underlying insulating film 151 is exposed. The barrier metal 154a and the tungsten film 154b in the interconnection trenches 153 and the contact holes 152 thus remain unpolished as the first-layer interconnections 154.

Next, referring to FIG. 41, by process steps similar to those shown in FIGS. 37 and 38, (a) a silicon oxide film 155a, a silicon nitride film 155b, and a silicon oxide film 155c are deposited in this order all over the surface to form the first interlayer insulating film 155, (b) the interconnection trenches 157 are formed in the silicon oxide film 155c by using the silicon nitride film 155b as an etching stopper, and (c) the via holes 156 are formed in the first interlayer insulating film 155.

Next, referring to FIG. 42, a foundation film 158a is formed all over the surface by PVD or CVD; for example, the foundation film 158a is formed of a tantalum (Ta) film, a tantalum nitride (TaN) film, a stacked film of a tantalum film and a tantalum nitride film, a titanium nitride film, or a stacked film of a titanium film and a titanium nitride film. The formation of the foundation film 158a prevents copper contained in the copper interconnections from diffusing into the nearby insulating films (silicon oxide film etc.). Next, a copper seed film (not shown) as a foundation film for electroplating is formed all over the surface by PVD or CVD. Next, a copper film 158b is formed all over the surface by electroplating using a plating solution mainly containing copper sulfate.

Next, referring to FIG. 43, the copper film 158b and the foundation film 158a are polished by CMP using a hydrogen-peroxide-based alumina abrasive until the top surface of the first interlayer insulating film 155 is exposed. The foundation film 158a and the copper film 158b in the interconnection trenches 157 and the via holes 156 thus remain unpolished as the second-layer interconnections 158.

The sequence of process steps for forming the interconnections, i.e. previously forming the via holes and interconnection trenches in the interlayer insulating film, forming a metal film thick enough to entirely fill the via holes and interconnection trenches, and then removing the unwanted part of the metal film by CMP, is known as a dual damascene process.

Next, referring to FIG. 44, a silicon nitride film 159a which functions as a copper diffusion preventing film, a silicon oxide film 159b, a silicon nitride film 159c, and a silicon oxide film 159d are deposited in this order on the entire surface by, e.g. plasma CVD, so as to form the four-layered second interlayer insulating film 159. Next, by process steps similar to those shown in FIGS. 41 to 43, (a) the interconnection trenches 161 are formed in the silicon oxide film 159d using the silicon nitride film 159c as an etching stopper, (b) the via holes 160 are formed in the second interlayer insulating film 159, (c) a foundation film 162a and a copper seed film (not shown) are formed all over the surface, (d) a copper film 162b is formed all over the surface, and (e) the copper film 162b and the foundation film 162a are polished until the top surface of the second interlayer insulating film 159 is exposed, so as to form the third-layer interconnections 162.

Next, referring to FIG. 45, by a process similar to that shown in FIG. 44, (a) a silicon nitride film 163a, a silicon oxide film 163b, a silicon nitride film 163c, and a silicon oxide film 163d are deposited in this order all over the surface to form the four-layered third interlayer insulating film 163, (b) the interconnection trenches 165 are formed in the silicon oxide film 163d by using the silicon nitride film 163c as an etching stopper, (c) the via holes 164 are formed in the third interlayer insulating film 163, (d) a foundation film 166a and a copper seed film (not shown) are formed all over the surface, (e) a copper film 166b is formed all over the surface, and (f) the copper film 166b and the foundation film 166a are polished until the top surface of the third interlayer insulating film 163 is exposed, so as to form the fourth-layer interconnections 166.

Next, referring to FIG. 46, by a process similar to that shown in FIG. 44, (a) a silicon nitride film 167a, a silicon oxide film 167b, a silicon nitride film 167c, and a silicon oxide film 167d are deposited in this order all over the surface to form the four-layered fourth interlayer insulating film 167, (b) the interconnection trench 169L and the electrode trench 169P are formed in the silicon oxide film 167d using the silicon nitride film 167c as an etching stopper, (c) the via holes 168 are formed in the fourth interlayer insulating film 167, (d) a foundation film 170a and a copper seed film (not shown) are formed all over the surface, (e) a copper film 170b is formed all over the surface, and (f) the copper film 170b and the foundation film 170a are polished until the top surface of the fourth interlayer insulating film 167 is exposed, so as to form the fifth-layer interconnection 170. The bonding pad 171 composed of a foundation film 171a and a copper film 171b is also formed in the electrode trench 169P during the process of polishing the copper film 170b and the foundation film 170a.

Next, referring to FIG. 47, a fine silicon nitride film 172a, which functions as a copper diffusion preventing film, and an insulating film 172b, e.g. a silicon oxide film, are formed by CVD in this order all over the surface, so as to form the protective insulating film 172. Next, the buffer coat film 173 is formed by CVD all over the surface. Next, the buffer coat film 173 and the protective insulating film 172 are partially removed by photolithography and anisotropic dry etching to form the opening 174. This exposes part of the top surface of the bonding pad 171. Next, the semiconductor wafer is separated by dicing into individual chips and the chips are bonded on the back to leadframes or mount boards (neither is shown) with resin or solder.

Next, referring to FIG. 48, the bonding wire 175 is inserted in the opening 174 and bonded to the bonding pad 171 by an ultrasonic or thermocompression process. At this time the metal layer 176 is formed at the interface between the bonding wire 175 and the bonding pad 171.

Finally, the entire structure shown in FIG. 48 is sealed with the molding resin 177 to obtain the structure shown in FIG. 36.

FIG. 49 is a cross-sectional view showing a part of the structure shown in FIG. 34 and further a part of it in an enlarged manner. Usually, a passive film 133, mainly formed of $Al_2O_3$ and having a thickness of about 1 to 3 nm, is formed on the surface of the bonding pad 126 (strictly speaking, on the surface of the aluminum alloy film 126b) by the effect of the etching process for forming the opening 129.

FIG. 50 is a cross-sectional view showing a part of the structure shown in FIG. 35 and further a part of it in an enlarged manner. Bonding the bonding wire 130 made of gold to the bonding pad 126 made of an aluminum alloy utilizes the mechanism of destroying the passive film 133 on the surface of the bonding pad 126 by, e.g. ultrasonic waves or thermocompression, and causing gold and aluminum to react at the interface between the bonding wire 130 and the bonding pad 126, so as to form the metal layer 131 which is a layer of a compound of the two elements.

Accordingly, enhancing the bonding strength to obtain a stable connection requires temperature and mechanical pressure enough to destroy the passive film 133 and satisfactorily form the metal layer 131 at the interface. Hence, as the device is downsized and the bonding pad 126 and the bonding wire 130 are reduced in size or diameter, it is necessary to apply higher compression strength or higher ultrasonic strength per unit area.

However, increasing the compression strength or ultrasonic strength may cause the bonding pad 126 to peel off the fourth interlayer insulating film 122 underlying the bonding pad 126, or may make cracks in the fourth interlayer insulating film 122.

FIG. 51 is a cross-sectional view showing a part of the structure shown in FIG. 47 and further a part of it in an enlarged manner. Copper is more susceptible to oxidization than aluminum and the self-passivation effect of the oxide film (CuO) formed on the copper surface is smaller than that of the oxide film formed on the aluminum surface. Therefore, when the top surface of the bonding pad 171 is exposed by the formation of the opening 174, the top surface of the bonding pad 171 is quickly oxidized to form a relatively thick oxide film 178 of about 5 to 10 nm in thickness.

FIG. 52 is a cross-sectional view showing part of the structure shown in FIG. 48 and further a part of it in an enlarged manner. The relatively thick oxide film 178 is formed on the top surface of the bonding pad 171 as shown in FIG. 51. The oxide film 178 cannot be sufficiently destroyed by widespread conventional process such as the ultrasonic or thermocompression wire bonding. Therefore the metal layer 176 cannot be formed uniformly at the interface between the bonding wire 175 and the bonding pad 171, which leads to poor reliability and stability at the connection. This problem will become more serious as the device is further downsized and the bonding pad 171 and the bonding wire 175 are further reduced in size or diameter.

Some methods are suggested to solve this problem: for example, a method in which wire bonding is conducted in a reducing atmosphere with hydrogen gas, or a flip chip method in which metal bumps of gold, solder, etc. are formed on the pad electrodes without wire bonding. However, these methods have other problems such as poor stability, increased cost, etc.

Furthermore, when a redundancy circuit is formed in the semiconductor device shown in FIG. 36, fuses of the redundancy circuit are formed of copper interconnections in the uppermost layer. However, since copper has lower thermal conductivity than aluminum, completely blowing (cutting) the fuses requires higher blowing energy than blowing fuses made of aluminum or an aluminum alloy. Accordingly, in semiconductor devices having multilayer copper interconnection structure, the fuses of redundancy circuits made of copper interconnections may not be properly blown out, leading to reduced yield.

SUMMARY OF THE INVENTION

It is an object of the present invention to obtain a semiconductor device having a multilayer interconnection structure using low-resistance copper interconnections, bonding wires can be bonded to bonding pads with enhanced reliability and stability at the connections. It is still an object of the present invention to obtain a semiconductor device in which the performance of blowing the fuses of redundancy circuits can be enhanced in a semiconductor device having a multilayer interconnection structure using copper interconnections.

The semiconductor device includes a multilayer interconnection structure in which a plurality of interconnection layers are formed in an insulating film. The multilayer interconnection structure has a first metal film, a second metal film and a third metal film. The first metal film is made of a first material and functions as a first interconnection belonging to an interconnection layer other than an uppermost interconnection layer. The second metal film is made of a second material and functions as a second interconnection belonging to the uppermost interconnection layer. The second material has a lower resistance and is more susceptible to oxidation than the first material. The third metal film is made of the first material, belongs to an interconnection layer other than the uppermost interconnection layer and functions as a bonding pad. The semiconductor device further includes an opening and a bonding wire. The opening is formed in the insulating film and has its bottom defined by the third metal film. The bonding wire is connected to the third metal film through the opening.

In the semiconductor device according to the present invention, the bonding pad is formed not of the easily-oxidized second material but of the first material less susceptible to oxidation than the second material. Accordingly the bonding wire can be bonded to the bonding pad with enhanced connecting reliability and stability.

According to a second aspect of the present invention, the semiconductor device includes a multilayer interconnection structure in which a plurality of interconnection layers are formed in an insulating film. The multilayer interconnection structure has a first metal film, a second metal film and a third metal film. The first metal film is made of a first material and functions as a first interconnection belonging to an interconnection layer other than an uppermost interconnection layer. The second metal film is made of a second material and functions as a second interconnection belonging to the uppermost interconnection layer. The second material has a lower resistance and a lower thermal conductivity than the first material. The third metal film is made of the first material, belongs to an interconnection layer other than the uppermost interconnection layer and functions as a fuse of a redundancy circuit. The semiconductor device further includes an opening. The opening is formed in the insulating film and has its bottom defined above the third metal film.

The fuse of the redundancy circuit is made not of the second material having a lower thermal conductivity, but of the first material having a higher thermal conductivity than the second material. Accordingly it is possible to obtain stable performance to blow the fuse.

Since the fuse is formed in a lower interconnection layer below the uppermost layer, variations in thickness of the insulating films above and below the fuse can be smaller than when the fuse is formed in the uppermost interconnection layer. As a result the stability of the blowing performance can be further enhanced.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 18 to 21 are cross-sectional views showing a sequence of process steps for manufacturing the semiconductor device of the third preferred embodiment of the invention;

DESCRIPTION OF THE PREFERRED EMBODIMENTS

First Preferred Embodiment

Figure 1:
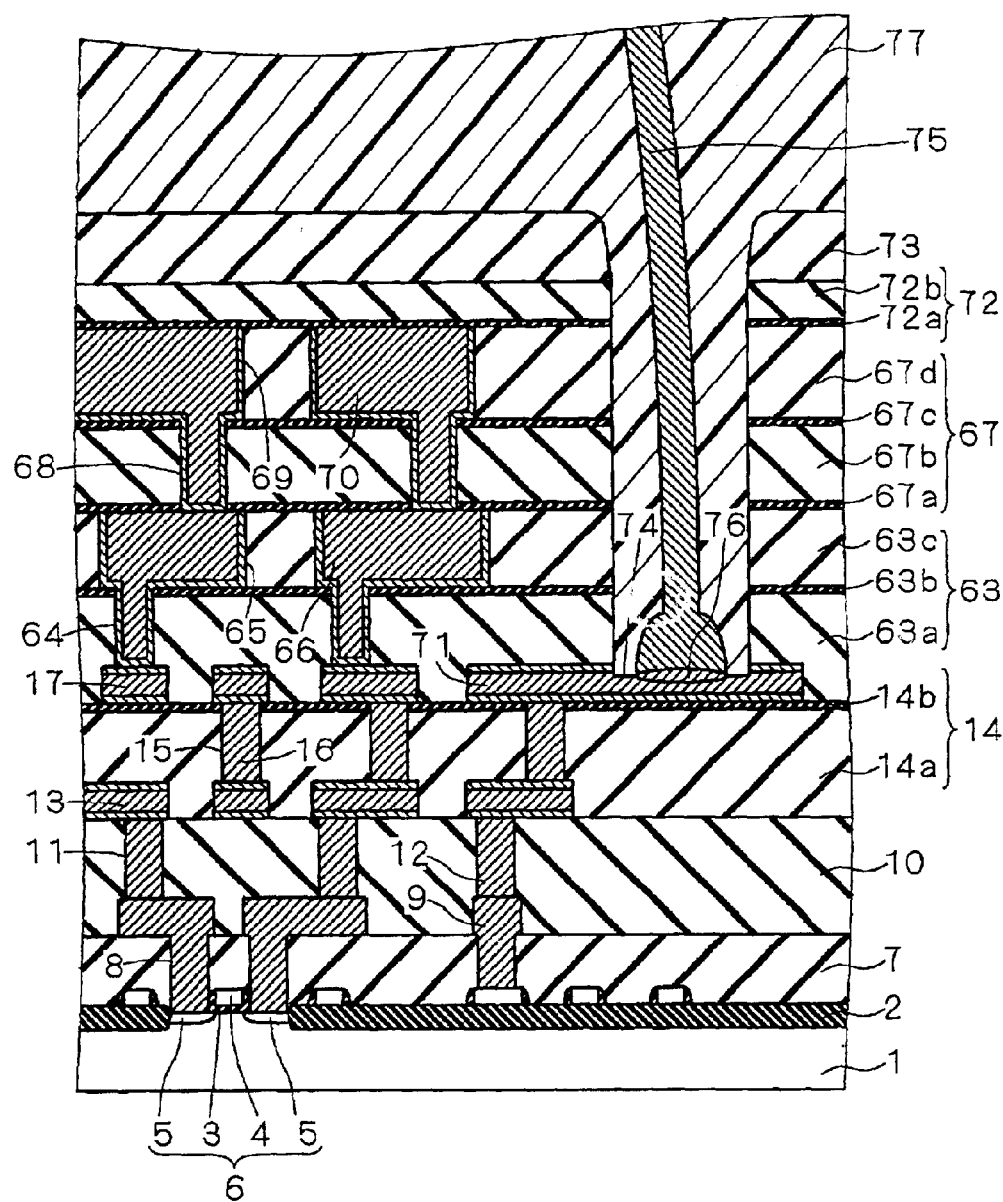
FIG. 1 is a cross-sectional view showing the structure of a semiconductor device according to a first preferred embodiment of the present invention.
Figure 2:
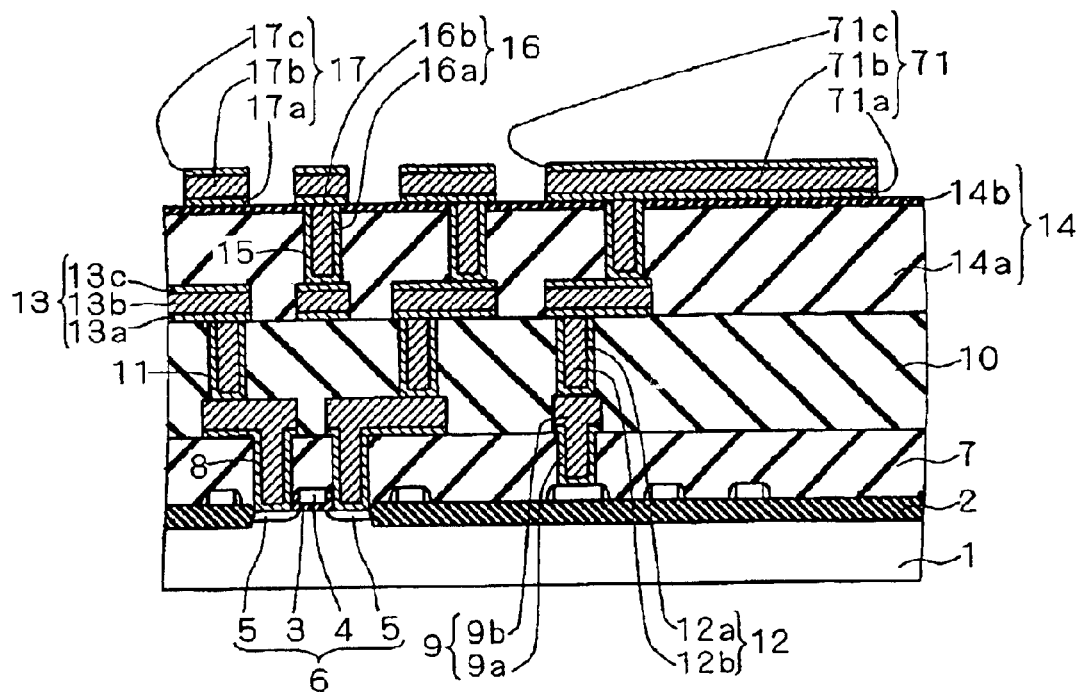
FIGS. 2 to 8 are cross-sectional views showing a sequence of process steps for manufacturing the semiconductor device of the first preferred embodiment of the invention.

FIG. 1 is a cross-sectional view showing the structure of a semiconductor device according to a first preferred embodiment of the present invention. As shown in FIG. 1, the semiconductor device of the first preferred embodiment has a multilayer interconnection structure composed of first-layer interconnections 9 made of tungsten, second- and third-layer interconnections 13 and 17 made of an aluminum alloy, and fourth- and fifth-layer interconnections 66 and 70 made of copper; the first- to fifth-layer interconnections are separated by interlayer insulating films.

An element isolation insulating film 2 made of a silicon oxide film is partially formed on a silicon substrate 1. Semiconductor elements such as MOSFETs 6 are formed in an element formation region defined by the element isolation insulating film 2. Each MOSFET 6 has a gate electrode 4 formed on an upper surface of the silicon substrate 1 with a gate insulating film 3 interposed therebetween, and a pair of source/drain regions 5 formed in the upper surface of the silicon substrate 1 with a channel formation region under the gate electrode 4 being interposed between the source/drain regions 5. While FIG. 1 shows gate electrodes 4 formed on the element isolation insulating film 2, the gate electrodes 4 of MOSFETs which are present in the depths of, or on this side of the paper extend on the element isolation insulating film 2.

An underlying insulating film 7 is formed all over the silicon substrate 1 to cover the MOSFETs 6 and the element isolation insulating film 2. The underlying insulating film 7 is formed of a silicon oxide film or a silicon oxide film implanted with an impurity element such as phosphorus or boron. Contact holes 8 are formed in the underlying insulating film 7 and connected to the MOSFETs 6. First-layer interconnections 9, made of tungsten, are formed partially on the underlying insulating film 7. The first-layer interconnections 9, which are local interconnections, are short in length. The first-layer interconnections 9 are connected to the MOSFETs 6 through the tungsten which fills the contact holes 8.

A first interlayer insulating film 10 is formed on the underlying insulating film 7 to cover the first-layer interconnections 9. The first interlayer insulating film 10 is formed of a silicon oxide film or the like. Via holes 11 are formed in the first interlayer insulating film 10 and connected to the first-layer interconnections 9. The via holes 11 are filled with via plugs 12 made of tungsten or the like. Second-layer interconnections 13, made of an aluminum alloy such as Al—Cu, Al—Si—Cu, or Al—Cu—Ti, are partially formed on the first interlayer insulating film 10. The second-layer interconnections 13, which are short-distance interconnections, are relatively short in length. The second-layer interconnections 13 are connected to the first-layer interconnections 9 through the via plugs 12.

A second interlayer insulating film 14 is formed on the first interlayer insulating film 10 to cover the second-layer interconnections 13. The second interlayer insulating film 14 has a silicon oxide film 14a and a silicon nitride film 14b which is formed on the silicon oxide film 14a and functions as a copper diffusion preventing film. Via holes 15 are formed in the second interlayer insulating film 14 and connected to the second-layer interconnections 13. The via holes 15 are filled with via plugs 16 made of tungsten or the like. Third-layer interconnections 17 and a bonding pad 71, both made of an aluminum alloy, are partially formed on the second interlayer insulating film 14. The third-layer interconnections 17, which are short-distance interconnections, are relatively short in length. The third-layer interconnections 17 and the bonding pad 71 are connected to the second-layer interconnections 13 through the via plugs 16.

A third interlayer insulating film 63 is formed on the second interlayer insulating film 14 to cover the third-layer interconnections 17 and the bonding pad 71. The third interlayer insulating film 63 has a structure in which a silicon oxide film 63a, a silicon nitride film 63b and a silicon oxide film 63c are stacked in this order. In the third interlayer insulating film 63, via holes 64 are formed and connected to the third-layer interconnections 17, and interconnection trenches 65 are formed and connected to the via holes 64. Fourth-layer interconnections 66, made of copper, are formed to fill the interconnection trenches 65. The fourth-layer interconnections 66, which are long-distance interconnections or power-supply lines, are relatively long in length. Also, the fourth-layer interconnections 66 are thicker than the first- to third-layer interconnections 9, 13 and 17 in order to reduce the interconnection resistance and to increase the permissible current density. The fourth-layer interconnections 66 are connected to the third-layer interconnections 17 through the copper which fills the via holes 64.

A fourth interlayer insulating film 67 is formed on the third interlayer insulating film 63. The fourth interlayer insulating film 67 has a structure in which a silicon nitride film 67a, which functions as a copper diffusion preventing film, a silicon oxide film 67b, a silicon nitride film 67c, and a silicon oxide film 67d are stacked in this order. In the fourth interlayer insulating film 67, via holes 68 are formed and connected to the fourth-layer interconnections 66 and interconnection trenches 69 are formed and connected to the via holes 68. Fifth-layer interconnections 70, made of copper, are formed to fill the interconnection trenches 69. The fifth-layer interconnections 70, which are long-distance interconnections or power-supply lines, are relatively long in length. Also, the fifth-layer interconnections 70 are thicker than the first- to third-layer interconnections 9, 13 and 17 in order to reduce the interconnection resistance and to increase the permissible current density. The fifth-layer interconnections 70 are connected to the fourth-layer interconnections 66 through the copper in the via holes 68.

A protective insulating film 72 is formed on the fourth interlayer insulating film 67. The protective insulating film 72 has a fine silicon nitride film 72a functioning as a copper oxidation preventing film and an insulating film 72b formed on the silicon nitride film 72a; the insulating film 72b is formed of a silicon oxide film, a silicon nitride film, a silicon oxynitride film, or a composite film thereof. A buffer coat film 73, when required, is formed on the protective insulating film 72. The buffer coat film 73 is made of polyimide or the like.

An opening 74, having its bottom defined by the bonding pad 71, is formed in part of the third interlayer insulating film 63, the fourth interlayer insulating film 67, the protective insulating film 72, and the buffer coat film 73. A bonding wire 75 is inserted in the opening 74 and bonded to the bonding pad 71. The bonding wire 75 is made of gold, aluminum, or the like. A metal layer 76 is formed at the interface between the bonding wire 75 and the bonding pad 71. When the bonding wire 75 and the bonding pad 71 are made of different materials, the metal layer 76 is a layer of a compound of the material metal of the bonding wire 75 and that of the bonding pad 71. When the two are made of the same material, the metal layer 76 is an inter-diffusion layer of the two material metals. The entire structure is sealed with a molding resin 77.

FIGS. 2 to 8 are cross-sectional views showing a sequence of process steps for manufacturing the semiconductor device of the first preferred embodiment. First, referring to FIG. 2, by process steps similar to those shown in FIGS. 27 to 30 described in the conventional technique, (a) the element isolation insulating film 2 is formed in the element isolation region of the silicon substrate 1, (b) the MOSFETs 6 are formed in the element formation region of the silicon substrate 1, (c) the underlying insulating film 7 is formed all over the surface, (d) the contact holes 8 are formed in the underlying insulating film 7, (e) a barrier metal 9a, formed of a stacked film of a titanium film and a titanium nitride film, is formed all over the surface, (f) a tungsten film 9b is formed all over the surface, (g) the barrier metal 9a and the tungsten film 9b are patterned to form the first-layer interconnections 9, (h) the first interlayer insulating film 10 having a highly flat top surface is formed all over the surface to cover the first-layer interconnections 9, (i) the via holes 11 are formed in the first interlayer insulating film 10, (j) a foundation film 12a, formed of a stacked film of a titanium film and a titanium nitride film, is formed all over the surface, (k) a tungsten film 12b is formed all over the surface, (l) the tungsten film 12b and the foundation film 12a are polished until the top surface of the first interlayer insulating film 10 is exposed, so as to form the via plugs 12, (m) a foundation film 13a, formed of a titanium film, a titanium nitride film, or a stacked film thereof, is formed all over the surface, (n) an aluminum alloy film 13b, e.g. made of Al—Cu, Al—Si—Cu, or Al—Cu—Ti, is formed all over the surface, (o) an antireflection film 13c made of titanium nitride is formed all over the surface, and (p) these films 13a to 13c are patterned to form the second-layer interconnections 13.

Next, the silicon oxide film 14a, having a highly flat top surface, is formed all over the surface-to cover the second-layer interconnections 13 by a process similar to that used to form the first interlayer insulating film 10. The silicon oxide film 14a is formed through a process of forming all over the surface a silicon oxide film thicker than the target thickness of the silicon oxide film 14a by CVD using high-density plasma etc. and a surface planarization process of polishing the surface of the silicon oxide film for a given thickness by CMP using a potassium-hydroxide- or ammonia-water-based silica abrasive. Alternatively, the silicon oxide film 14a is formed through a process of forming all over the surface a silicon oxide film thinner than the target thickness of the silicon oxide film 14a by CVD and a process of forming an SOG film on the silicon oxide film by spin coating.

Next, the silicon nitride film 14b, which functions as a copper diffusion preventing film, is deposited by CVD on the silicon oxide film 14a, so as to form the second interlayer insulating film 14. Next, by a process similar to that used to form the via plugs 12, (a) the via holes 15 are formed in the second interlayer insulating film 14, (b) a foundation film 16a and a tungsten film 16b are formed all over the surface, and (c) these films 16a and 16b are polished to form the via plugs 16.

Next, by a process similar to that used to form the second-layer interconnections 13, (a) a foundation film 17a, an aluminum alloy film 17b, and an antireflection film 17c are formed all over the surface, and (b) these films 17a to 17c are patterned to form the third-layer interconnections 17. The bonding pad 71, which is composed of a foundation film 71a, an aluminum alloy film 71b, and an antireflection film 71c, is also formed during the patterning of the films 17a to 17c.

Figure 3:
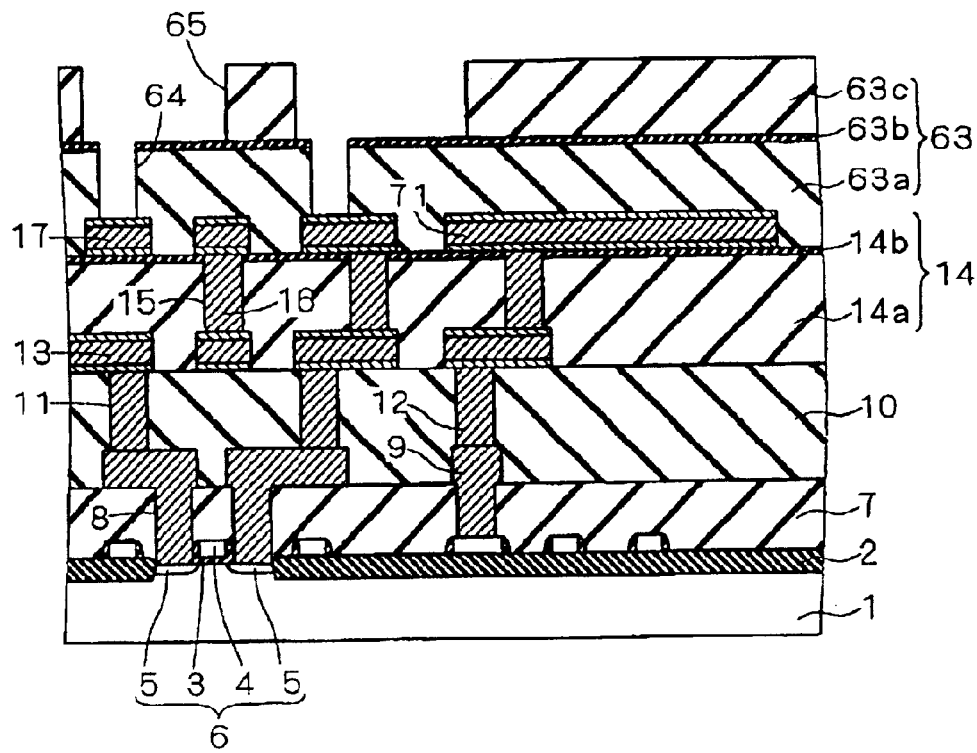

Next, referring to FIG. 3, the silicon oxide film 63a, the silicon nitride film 63b, and the silicon oxide film 63c are deposited in this order all over the surface by, e.g. plasma CVD, so as to form the third interlayer insulating film 63. Next, the interconnection trenches 65 are formed in the silicon oxide film 63c by photolithography and anisotropic dry etching. The anisotropic dry etching is carried out under such conditions that silicon oxide film is easily etched and silicon nitride film is not easily etched so that the silicon nitride film 63b can function as an etching stopper. Next, the via holes 64 are formed in the silicon nitride film 63b and the silicon oxide film 63a by photolithography and anisotropic dry etching.

Figure 4:
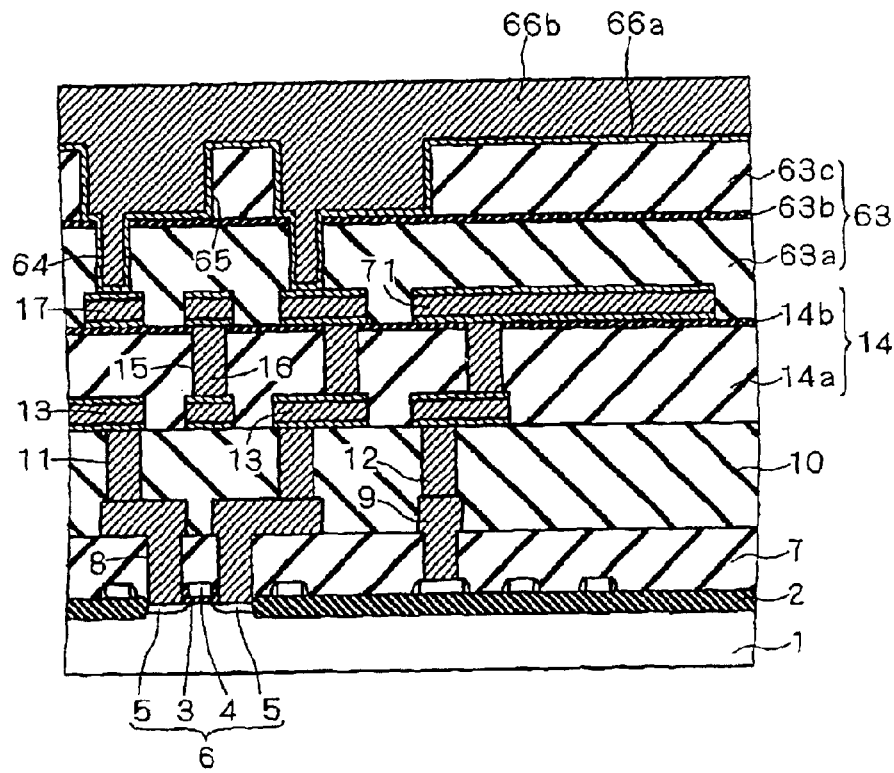

Next, referring to FIG. 4, a foundation film 66a is formed all over the surface by PVD or CVD; for example, the foundation film 66a is formed of a tantalum film, a tantalum nitride film, a stacked film of a tantalum film and a tantalum nitride film, a titanium nitride film, or a stacked film of a titanium film and a titanium nitride film. The formation of the foundation film 66a prevents copper contained in the copper interconnections from diffusing into nearby insulating films (silicon oxide film etc.). Next, a copper seed film (not shown) as a foundation film for electroplating is formed all over the surface by PVD or CVD. Next, a copper film 66b is formed all over the surface by electroplating using a plating solution mainly containing copper sulfate.

Figure 5:
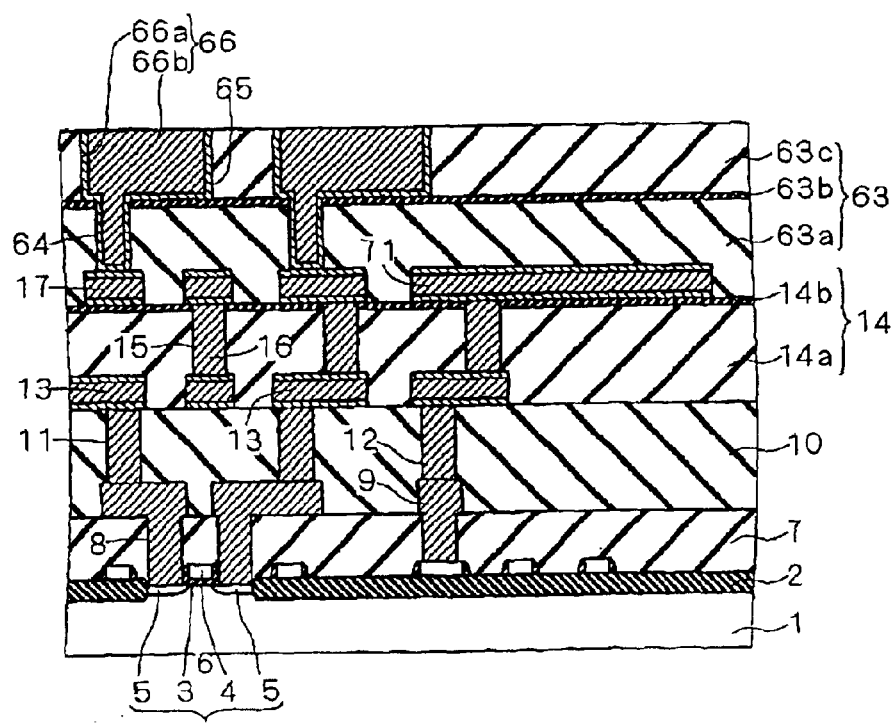

Next, referring to FIG. 5, the copper film 66b and the foundation film 66a are polished by CMP using a hydrogen-peroxide-based alumina abrasive until the top surface of the third interlayer insulating film 63 is exposed. The foundation film 66a and the copper film 66b in the interconnection trenches 65 and the via holes 64 thus remain unpolished as the fourth-layer interconnections 66.

Figure 6:
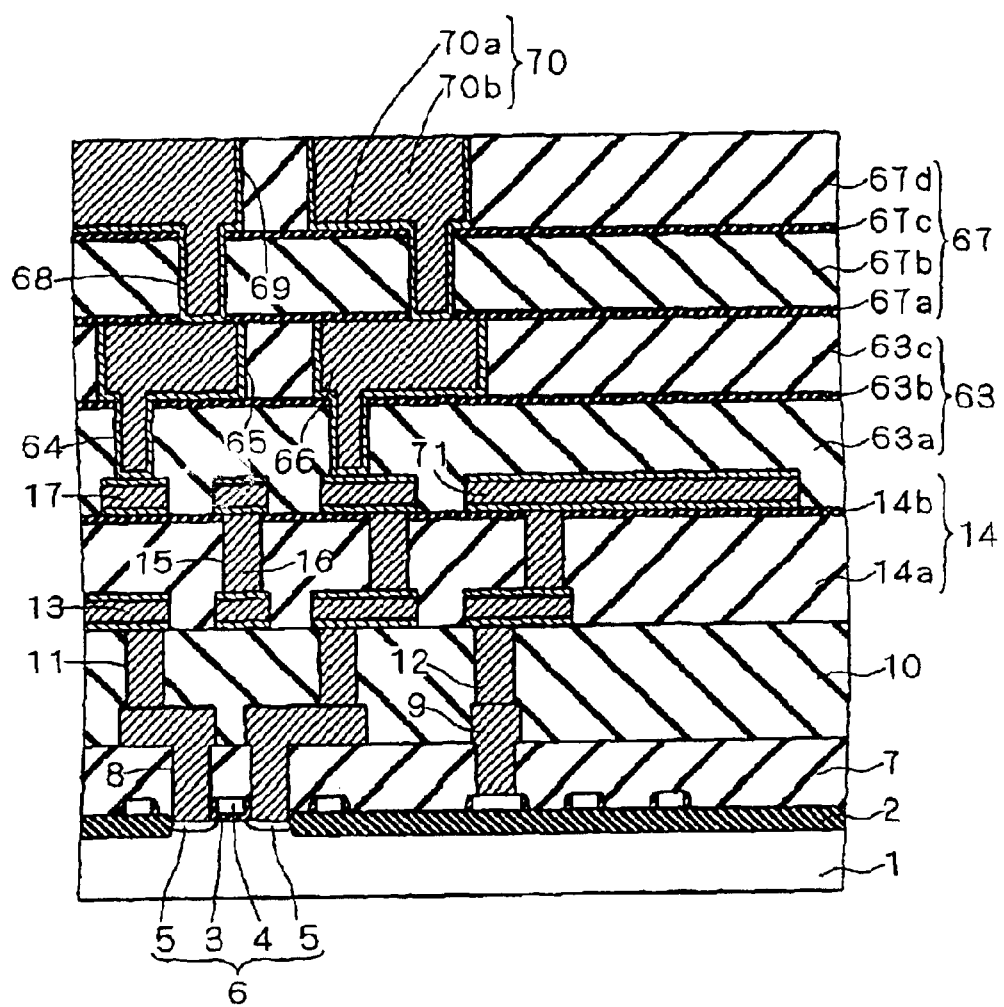

Next, referring to FIG. 6, by process steps similar to those shown in FIGS. 3 to 5, (a) the silicon nitride film 67a, the silicon oxide film 67b, the silicon nitride film 67c, and the silicon oxide film 67d are deposited in this order all over the surface, so as to form the four-layered fourth interlayer insulating film 67, (b) the interconnection trenches 69 are formed in the silicon oxide film 67d using the silicon nitride film 67c as an etching stopper, (c) the via holes 68 are formed in the fourth interlayer insulating film 67, (d) a foundation film 70a and a copper seed film (not shown) are formed all over the surface, (e) a copper film 70b is formed all over the surface, and (f) the copper film 70b and the foundation film 70a are polished until the top surface of the fourth interlayer insulating film 67 is exposed, so as to form the fifth-layer interconnections 70.

Figure 7:
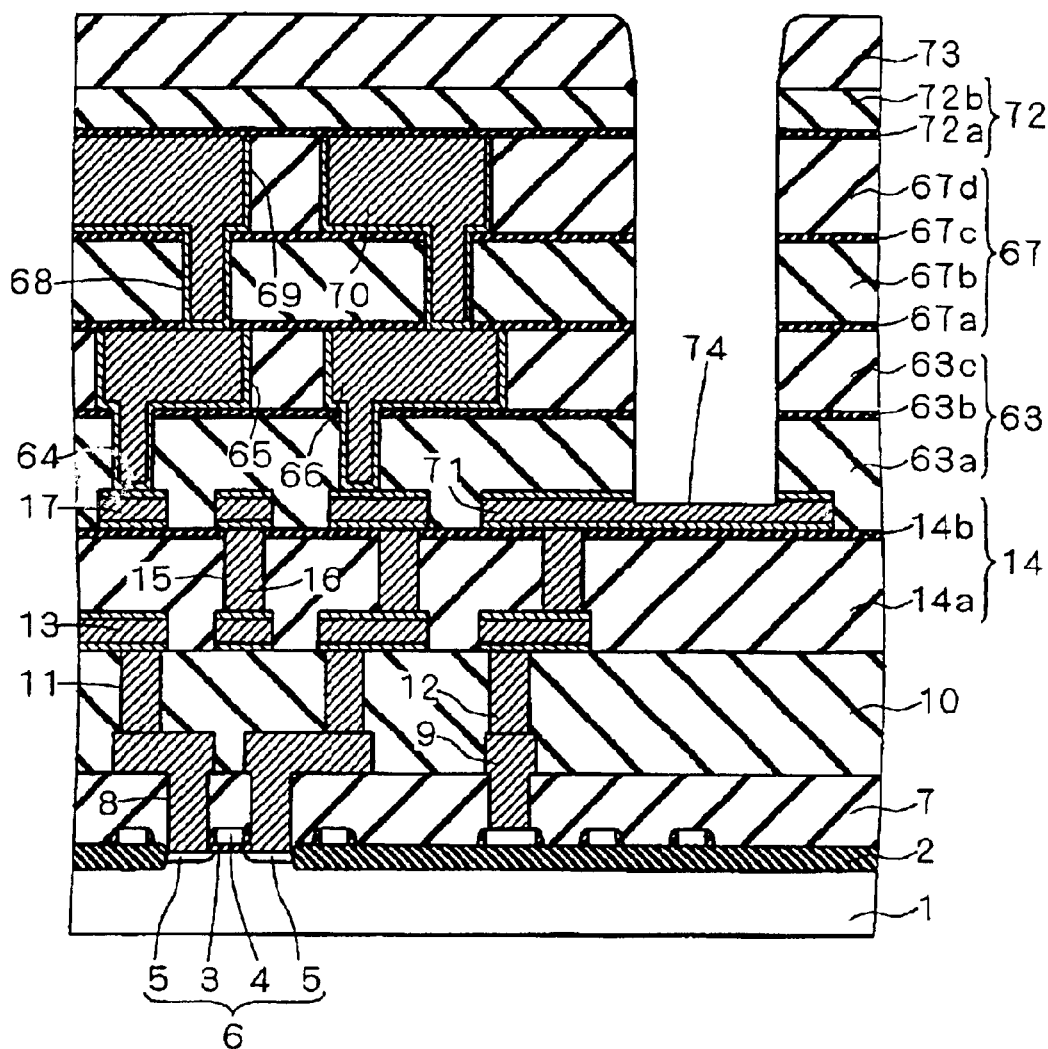

Next, referring to FIG. 7, the fine silicon nitride film 72a, which functions as a copper diffusion preventing film, and the insulating film 72b, e.g. a silicon oxide film, are formed by CVD in this order all over the surface, so as to form the protective insulating film 72. Next, the buffer coat film 73 is formed by CVD all over the surface. Next, the buffer coat film 73, the protective insulating film 72, the fourth interlayer insulating film 67, the third interlayer insulating film 63, and the antireflection film 71c of the bonding pad 71 are partially removed in this order by photolithography and anisotropic dry etching, so as to form the opening 74. Part of the top surface of the aluminum alloy film 71b of the bonding pad 71 is thus exposed. Next, the semiconductor wafer is separated by dicing into individual chips and the chips are bonded on the back to leadframes or mount boards (neither is shown) with resin or solder.

Figure 8:
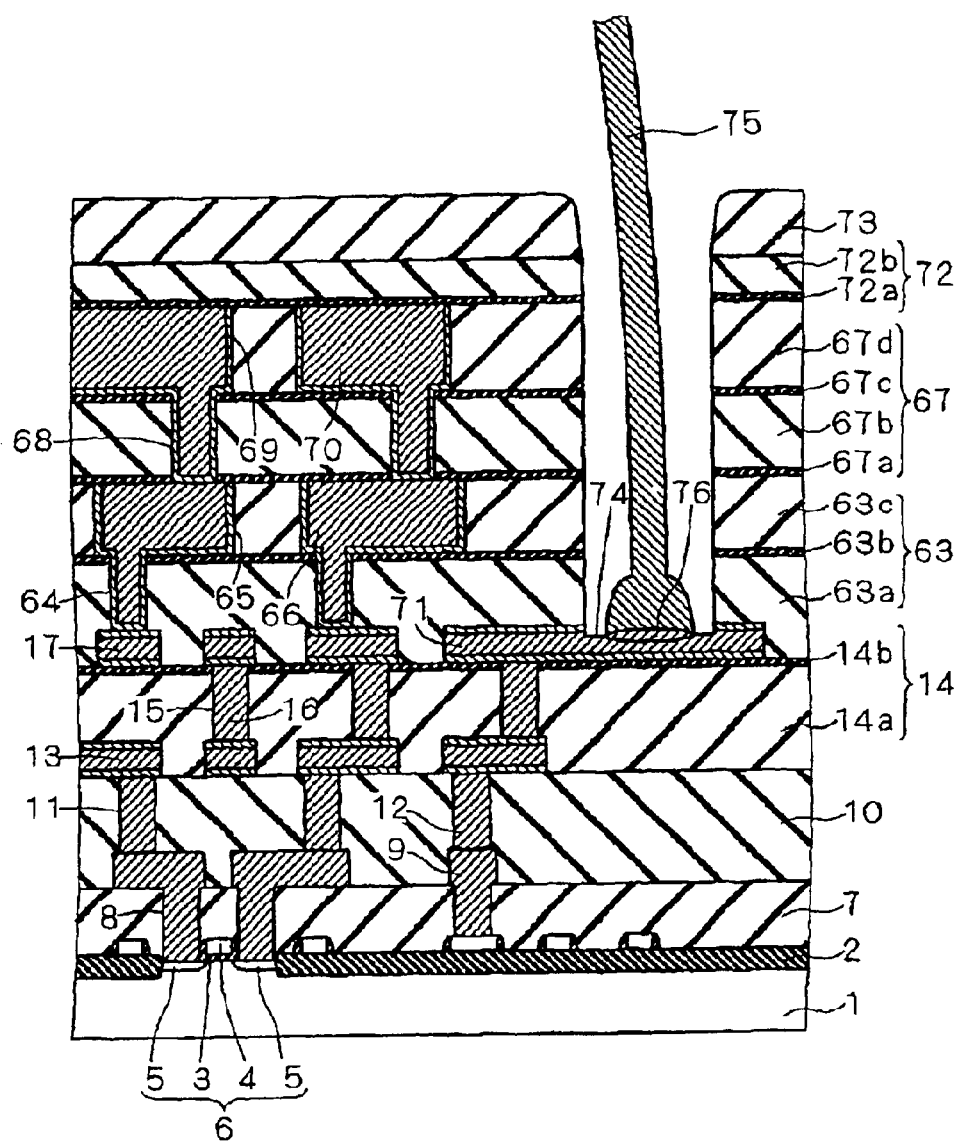

Next, referring to FIG. 8, the bonding wire 75 is inserted in the opening 74 and bonded to the bonding pad 71 by, e.g. an ultrasonic or thermocompression process. At this time the metal layer 76 is formed at the interface between the bonding wire 75 and the bonding pad 71.

Finally, the entire structure shown in FIG. 8 is sealed with the molding resin 77 to obtain the structure shown in FIG. 1.

As described above, according to the semiconductor device and its manufacturing method of the first preferred embodiment, the bonding pad 71 is not formed with easily oxidized copper in the uppermost interconnection layer, but the bonding pad 71 is formed of an aluminum alloy, which is less susceptible to oxidation than copper, in a lower interconnection layer other than the uppermost layer. The bonding wire 75 can thus be bonded to the bonding pad 71 to make a more reliable and more stable connection.

Second Preferred Embodiment

When the bonding pad 71 has a film thickness of 600 nm or less in the above-described semiconductor device of the first preferred embodiment, the silicon oxide film 14a underlying the bonding pad 71 may be cracked by the pressure applied to bond the bonding wire 75 to the bonding pad 71. A second preferred embodiment shows a semiconductor device with enhanced resistance to cracks.

Figure 9:
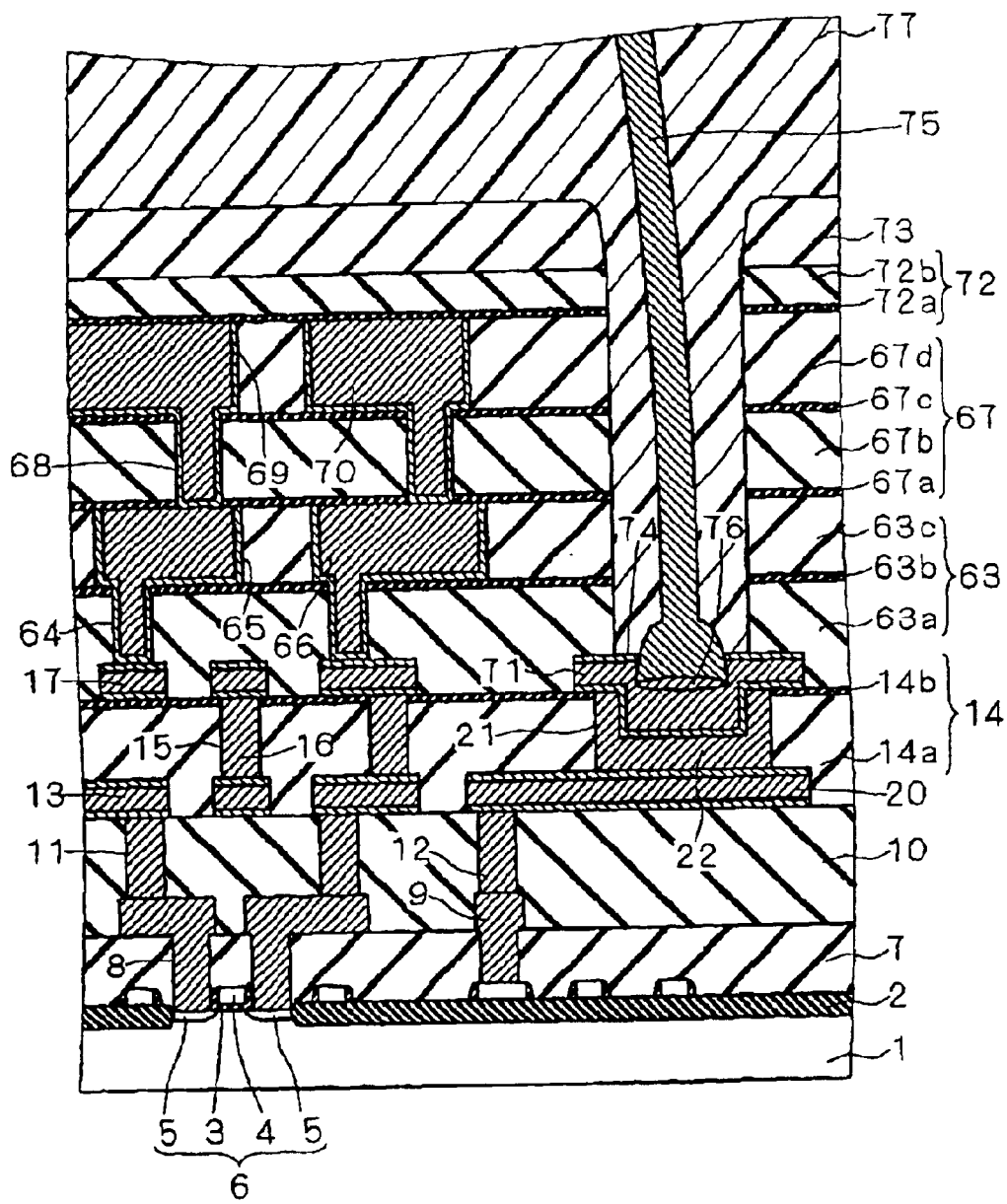
FIG. 9 is a cross-sectional view showing the structure of a semiconductor device according to a second preferred embodiment of the present invention.

FIG. 9 is a cross-sectional view showing the structure of a semiconductor device of the second preferred embodiment. A pad-like metal film 20, which belongs to the second interconnection layer, is formed on the first interlayer insulating film 10 below the bonding pad 71. The metal film 20 is connected to the first-layer interconnection 9 through the via plug 12. A via hole 21 whose bottom is defined by the metal film 20 is formed in the second interlayer insulating film 14 and a via plug 22 is formed on the sides and bottom of the via hole 21. The bonding pad 71 belonging to the third interconnection layer is formed on the via plug 22. The bonding pad 71 is thus connected to the metal film 20 through the via plug 22. That is to say, the bonding pad is composed of the metal film 20 belonging to the second interconnection layer, the via plug 22, and the metal film belonging to the third interconnection layer (which corresponds to the bonding pad 71 shown in FIG. 9 and which may be called "metal film 71" in the following preferred embodiments).

Figure 10:
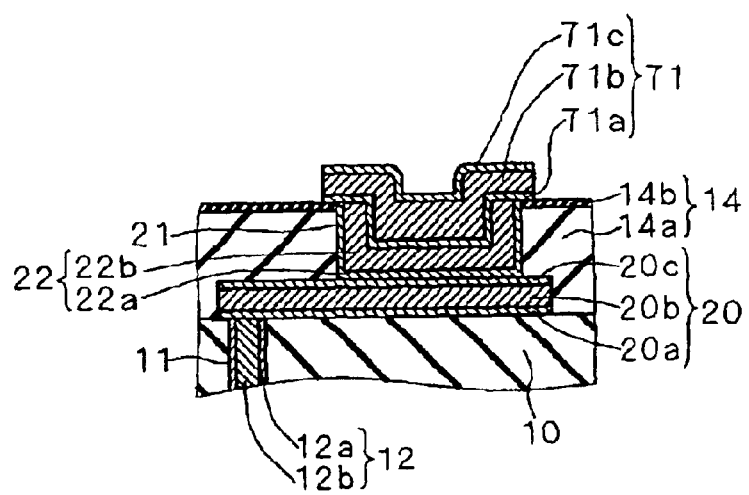
FIG. 10 is a cross-sectional view showing the structure of the bonding pad, where the bonding wire is not bonded yet.

FIG. 10 is a cross-sectional view specifically showing the structure of the metal film 71, the via plug 22 and the metal film 20, where the bonding wire 75 is not bonded yet. Like the third-layer interconnections 17, the metal film 71 has a structure in which the foundation film 71a, e.g. a titanium film, the aluminum alloy film 71b, e.g. made of Al—Cu, and the antireflection film 71c made of titanium nitride, are stacked in this order. Like the via plugs 16, the via plug 22 has a foundation film 22a, formed of a stacked film of a titanium film and a titanium nitride film, and a tungsten film 22b. Like the second-layer interconnections 13, the metal film 20 has a structure in which a foundation film 20a, e.g. formed of a titanium film, an aluminum alloy film 20b, e.g. made of Al—Cu, and an antireflection film 20c, made of titanium nitride, are stacked in this order.

The metal film 20 and the second-layer interconnections 13 are formed by the same process. The via hole 21 and the via holes 15 are formed by the same process. The via plug 22 and the via plugs 16 are formed by the same process. The metal film 71 and the third-layer interconnections 17 are formed by the same process.

Figure 11:
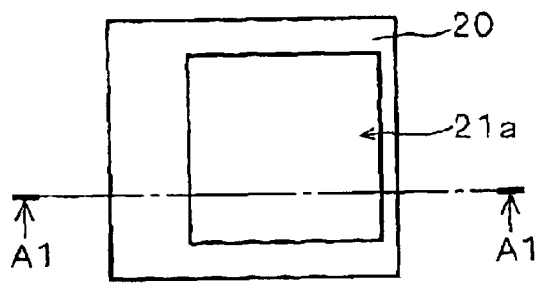
FIG. 11 is a top view showing a via hole of a first shape and the metal film.

Variations of the shape of the via hole 21 are now described. FIG. 11 is a top view showing a via hole 21a of a first shape and the metal film 20. The cross section taken along line A1—A1 in FIG. 11 corresponds to FIG. 10. Seen from above, the via hole 21a, like the metal film 71, is square or rectangular in shape (FIG. 11 shows an example of square shape).

Figure 12:
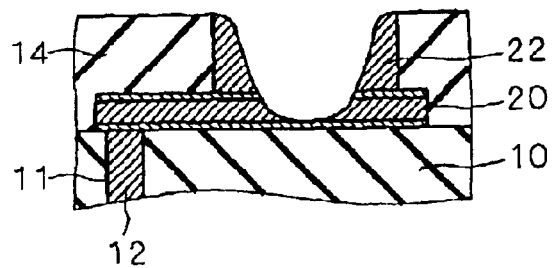
FIG. 12 is a cross-sectional view showing the metal film dissolved.

When the single via hole 21a with a large opening area is formed as shown in FIG. 11, the part of the tungsten film 22b and the foundation film 22a in the center of the via hole 21a may be lost during the CMP process for forming the via plug 22. In such a case the metal film 20 will be dissolved by HF solution used after polishing. FIG. 12 is a cross-sectional view showing the metal film 20 thus dissolved.

Desired examples of the shape of the via hole 21, for avoiding such a trouble, are now described.

Figure 13:
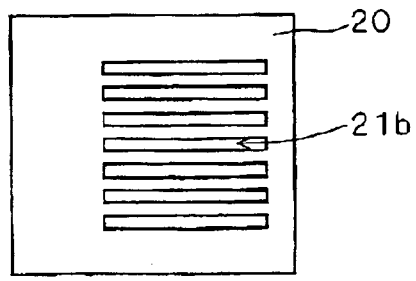
FIG. 13 is a top view showing via holes of a second shape and the metal film.

FIG. 13 is a top view showing via holes 21b of a second shape and the metal film 20. Seen from above, the via holes 21b are shaped into strips elongated in a given direction (in the lateral direction in the diagram, which direction is defined as "X direction"); a plurality of via holes 21b are arranged at equal intervals in a direction vertical to the X direction to form a slit-like pattern (they are arranged in the vertical direction in the diagram, which direction is defined as "Y direction").

Figure 14:
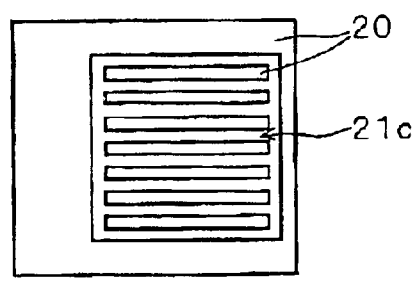
FIG. 14 is a top view showing a via hole of a third shape and the metal film.

FIG. 14 is a top view showing a via hole 21c of a third shape and the metal film 20. In the via hole 21c, seen from above, the plurality of via holes 21b shown in FIG. 13 are connected to each other at their ends in the X direction by two strip-like via holes elongated in the Y direction. A plurality of strips of silicon oxide film 14a surrounded by the via plug 22 are thus formed independent of each other. Accordingly, even if a crack is made in a strip of silicon oxide film 14a, it will not propagate to other strips of silicon oxide film 14a. Thus, even when a crack is made, it provides only a limited, slight effect and the silicon oxide film 14a thus offers enhanced resistance to cracks.

Figure 15:
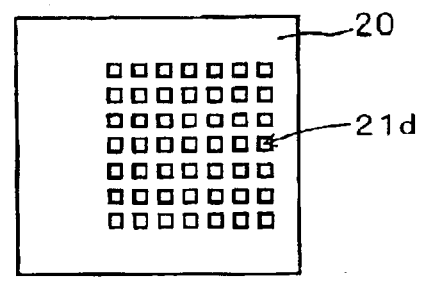
FIG. 15 is a top view showing via holes of a fourth shape and the metal film.

FIG. 15 is a top view showing via holes 21d of a fourth shape and the metal film 20. Seen from above, the via holes 21d are shaped in small squares; a plurality of via holes 21d are arranged at equal intervals in the X and Y directions to form a dot-like pattern. The opening area of each via hole 21d is equal to that of the via hole 15, for example.

Figure 16:
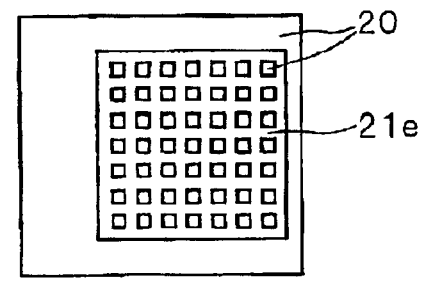
FIG. 16 is a top view showing a via hole of a fifth shape and the metal film.

FIG. 16 is a top view showing a via hole 21e of a fifth shape and the metal film 20. Seen from above, the via hole 21e is shaped like a grid, with a plurality of strip-like via hole parts elongated in the X direction crossing a plurality of strip-like via hole parts elongated in the Y direction. With the via hole 21e, the silicon oxide film 14a remains as a plurality of column-like pieces, so that the silicon oxide film 14a offers higher resistance to cracks than with the via holes 21b to 21d of other shapes.

As described above, according to the semiconductor device and its manufacturing method of the second preferred embodiment, the bonding pad includes the metal film 71 belonging to the third interconnection layer and the metal film 20 belonging to the second interconnection layer. Accordingly, the bonding pad has a larger film thickness than when it is formed only of the metal film 71. It is therefore possible to suppress formation of cracks in the first interlayer insulating film 10 underlying the bonding pad during bonding of the bonding wire 75 to the bonding pad.

Third Preferred Embodiment

In the semiconductor device of the second preferred embodiment, the bonding pad is formed with a plurality of metal films belonging to a plurality of interconnection layers. However, even in such a structure, the bonding pad may not be thick enough, or aluminum interconnections may be formed only in a single layer. Assuming such cases, a third preferred embodiment shows an improved semiconductor device and its manufacturing method.

Figure 17:
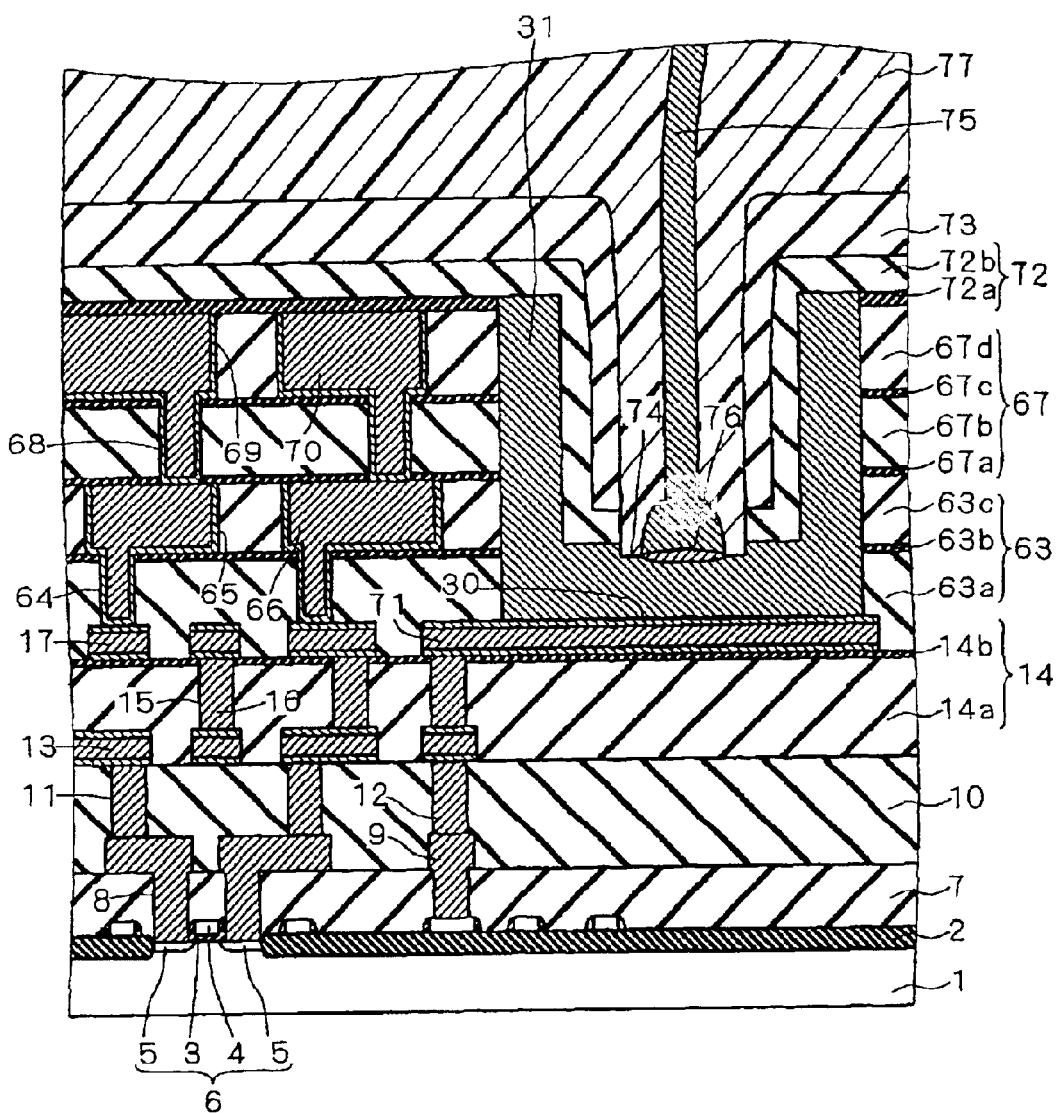
FIG. 17 is a cross-sectional view showing the structure of a semiconductor device according to a third preferred embodiment of the invention.

FIG. 17 is a cross-sectional view showing the structure of a semiconductor device of the third preferred embodiment of the present invention. A metal film 71, which is wider than those shown in the first and second preferred embodiments, is formed on the second interlayer insulating film 14. An opening 30, whose bottom is defined by the metal film 71, is formed in the third interlayer insulating film 63, the fourth interlayer insulating film 67, and the silicon nitride film 72a. The opening 30 has a larger opening area than the opening 74 of the first and second preferred embodiments. A metal film 31 made of aluminum is formed on the sides and bottom of the opening 30. The metal film 71 and the metal film 31 form the bonding pad. The bonding wire 75 is bonded to the metal film 31. The insulating film 72b, e.g. a silicon oxide film, is formed on the metal film 31 except at the connection with the bonding wire 75.

FIGS. 18 to 21 are cross-sectional views showing a sequence of process steps for manufacturing the semiconductor device of the third preferred embodiment. Referring to FIG. 18, first, the structure shown in FIG. 6 is obtained as described in the first preferred embodiment. However, note that, in the process step shown in FIG. 2, the metal film 71 is formed wider than that shown in the first preferred embodiment. Next, the silicon nitride film 72a is formed on the fourth interlayer insulating film 67. Next, the silicon nitride film 72a, the fourth interlayer insulating film 67 and the third interlayer insulating film 63 are partially removed in this order by photolithography and anisotropic dry etching, so as to form the opening 30. The top surface of the metal film 71 is thus exposed.

Figure 19:
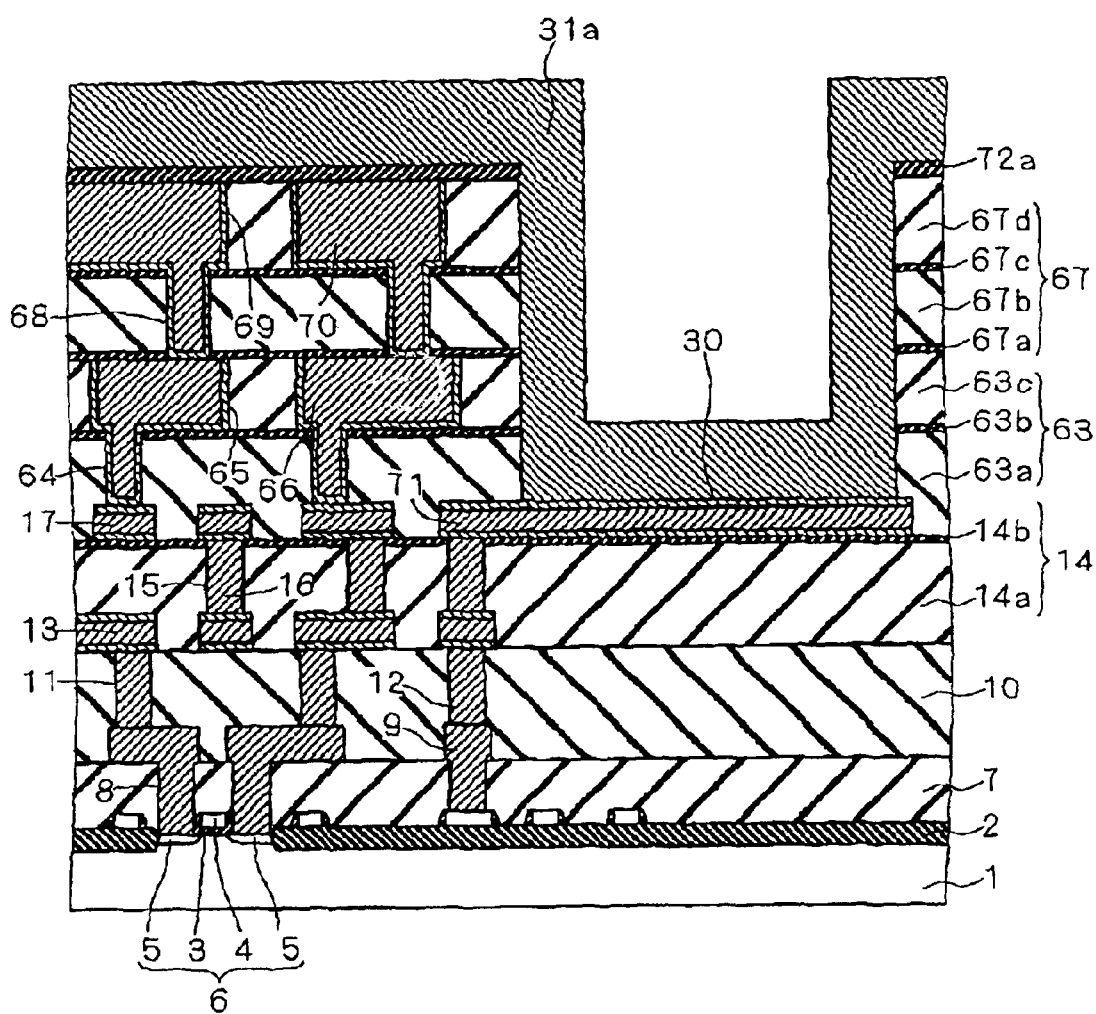

Next, referring to FIG. 19, a passive film (not shown), chiefly formed of $Al_2O_3$ on the top surface of the metal film 71, is removed by sputter etching using argon (Ar) ions. Next, an aluminum film 31a of about 100 to 700 nm thick is formed all over the surface by PVD or CVD.

Figure 20:
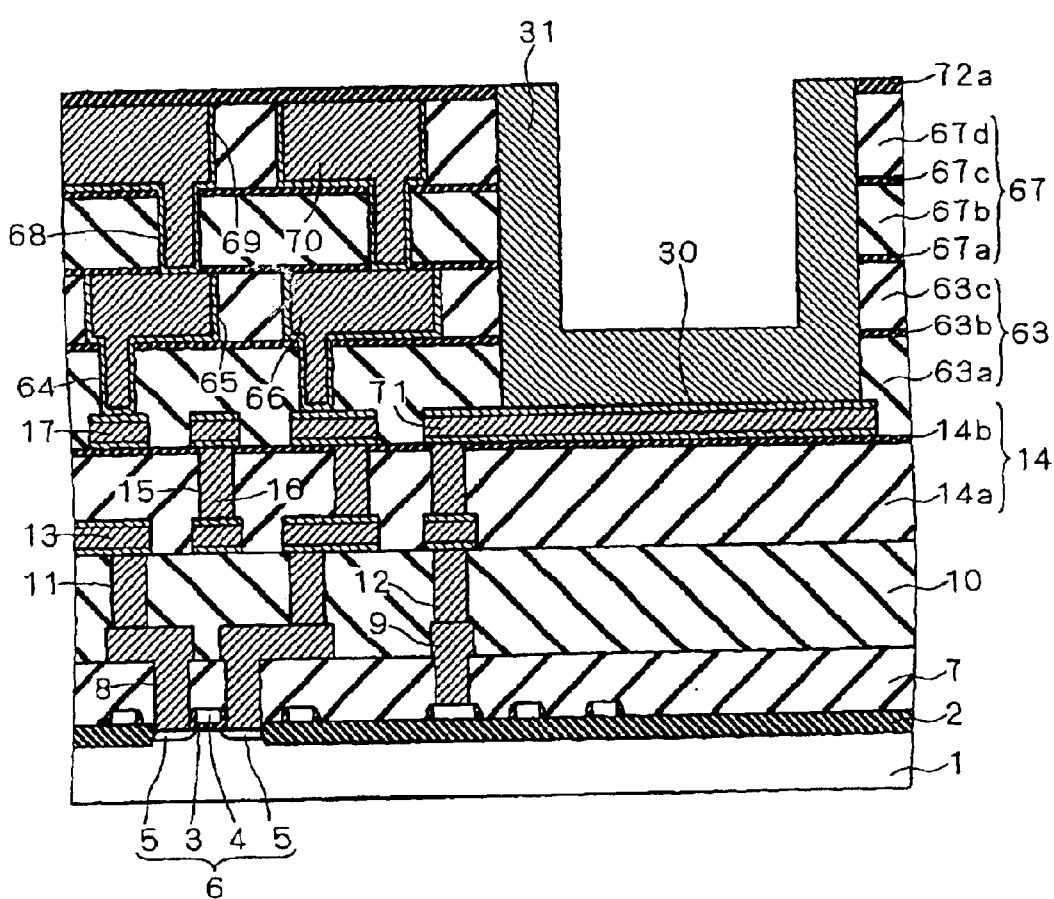

Next, referring to FIG. 20, the aluminum film 31a is polished by CMP using hydrogen-peroxide-based alumina abrasive or silica abrasive until the top surface of the silicon nitride film 72a is exposed. The aluminum film 31a in the opening 30 thus remains unpolished as the metal film 31. The metal film 31 functions as the bonding pad together with the metal film 71.

Figure 21:
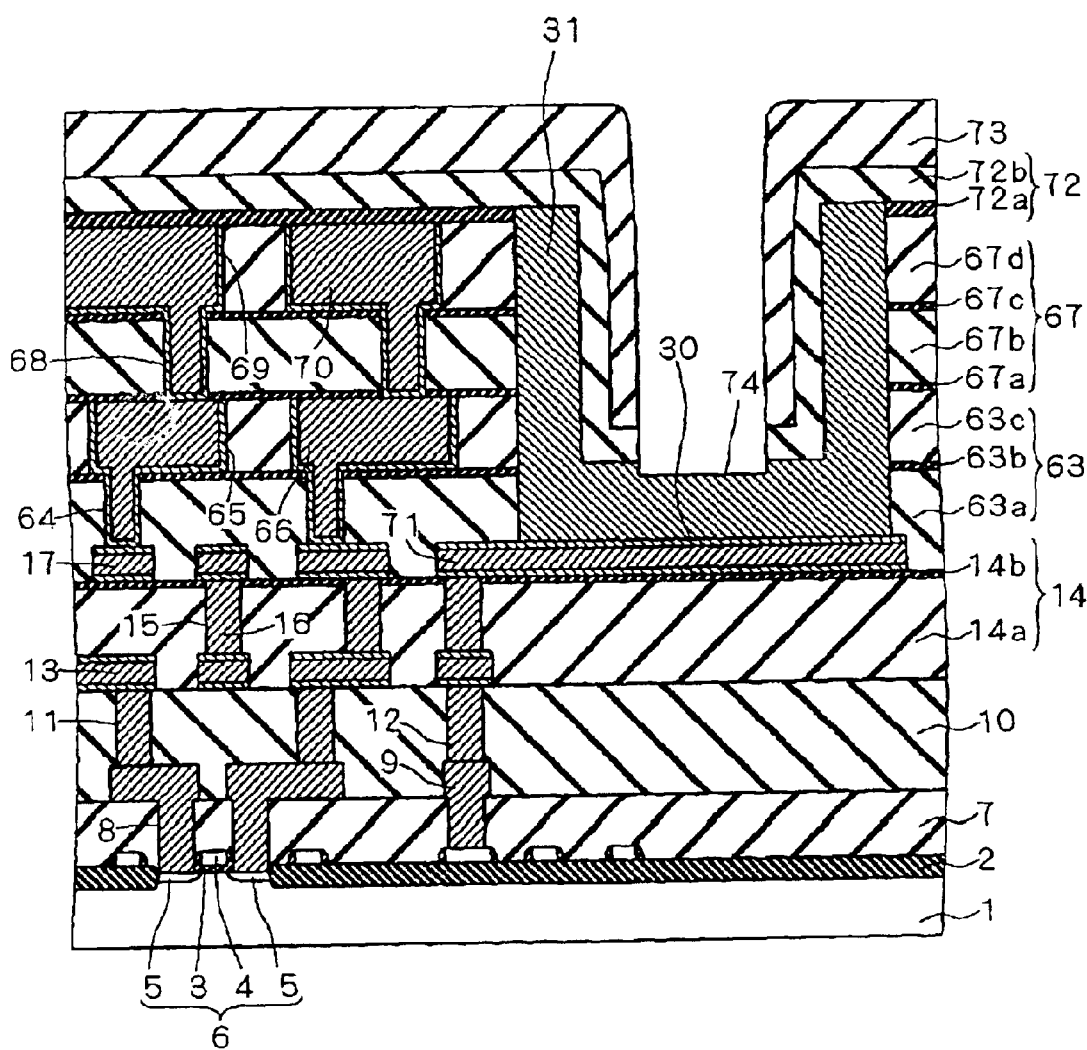

Next, referring to FIG. 21, the insulating film 72b, e.g. a silicon oxide film, is formed all over the surface and then the buffer coat film 73 is formed all over the surface when required. Next, the buffer coat film 73 and the insulating film 72b are partially removed in this order by photolithography and anisotropic dry etching, so as to form the opening 74 whose bottom is defined by the metal film 31.

Next, the semiconductor wafer is separated by dicing into individual chips and the chips are bonded on the back to leadframes or mount boards (neither is shown) with resin or solder. Next, the bonding wire 75 is inserted in the opening 74 and bonded to the metal film 31. Finally the entire structure is sealed with the molding resin 77 to obtain the structure shown in FIG. 17.

As described above, according to the semiconductor device and its manufacturing method of the third preferred embodiment, the bonding pad can be thicker by the thickness of the metal film 31 formed on the metal film 71, so that the bonding wire 75 can be bonded to the bonding pad with enhanced connecting reliability and stability.

Fourth Preferred Embodiment

Figure 22:
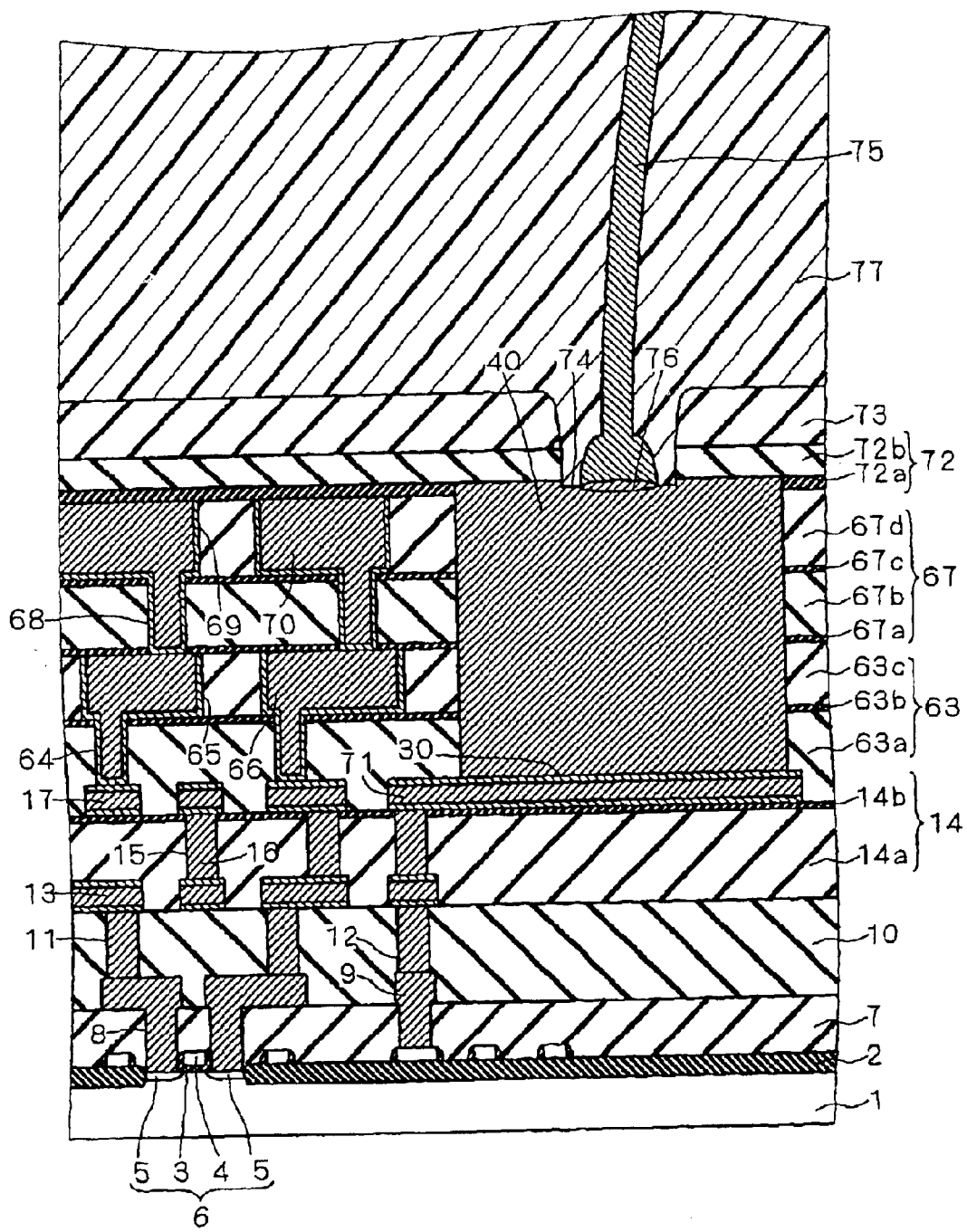
FIG. 22 is a cross-sectional view showing the structure of a semiconductor device according to a fourth preferred embodiment of the invention.

FIG. 22 is a cross-sectional view showing the structure of a semiconductor device according to a fourth preferred embodiment of the present invention. A metal film 71, like that of the third preferred embodiment, is formed on the second interlayer insulating film 14. An opening 30, like that of the third preferred embodiment, is formed in the third interlayer insulating film 63, the fourth interlayer insulating film 67 and the silicon nitride film 72a. The opening 30 is filled with a metal film 40 made of a noble metal, such as gold, or aluminum. The metal film 40 and the metal film 71 form the bonding pad. The bonding wire 75 is bonded to the metal film 40. The insulating film 72b, e.g. a silicon oxide film, is formed on the metal film 40 except at the connection with the bonding wire 75.

Figure 23:
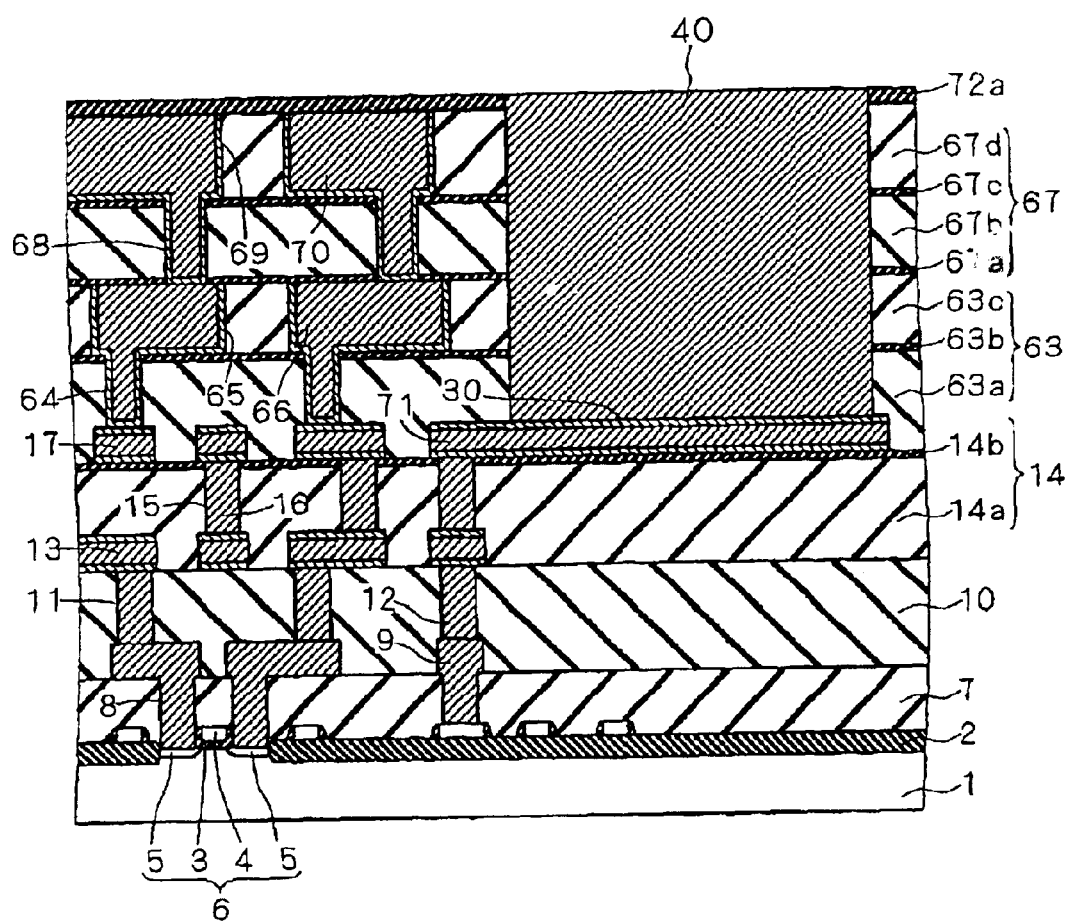
FIGS. 23 and 24 are cross-sectional views showing a sequence of process steps for manufacturing the semiconductor device of the fourth preferred embodiment of the invention.
Figure 24:
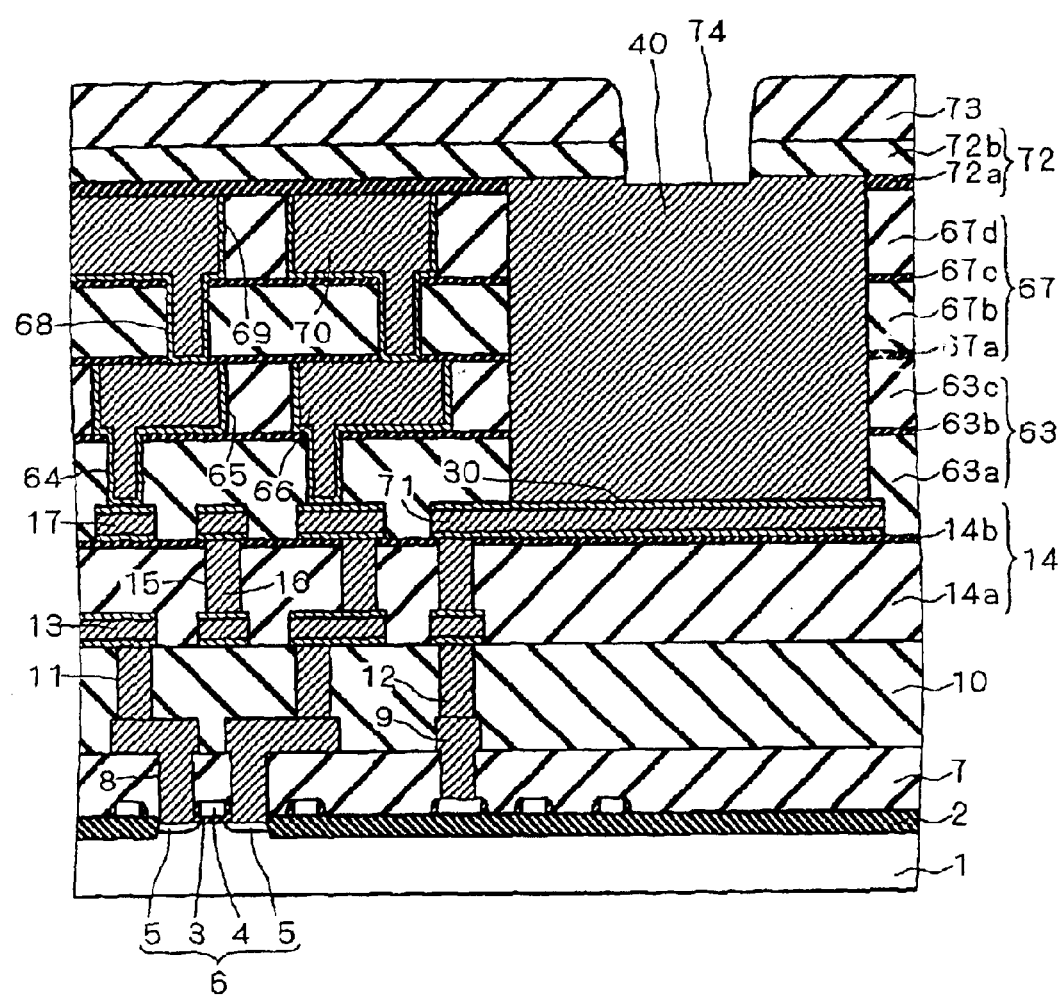

FIGS. 23 and 24 are cross-sectional views showing a sequence of process steps for manufacturing the semiconductor device of the fourth preferred embodiment. First, referring to FIG. 23, the structure shown in FIG. 18 is obtained by process similar to that of the third preferred embodiment. Next, the metal film 40, which fills the opening 30, is formed by electroless plating on the metal film 71 in the part exposed as the bottom of the opening 30. The metal film 40 functions as the bonding pad together with the metal film 71.

Next, referring to FIG. 24, the insulating film 72b, e.g. a silicon oxide film, is formed all over the surface and then the buffer coat film 73 is formed all over the surface when required. Next, the buffer coat film 73 and the insulating film 72b are partially removed in this order by photolithography and anisotropic dry etching, so as to form the opening 74 whose bottom is defined by the metal film 40.

Next, the semiconductor wafer is separated by dicing into individual chips and the chips are bonded on the back to leadframes or mount boards (neither is shown) with resin or solder. Next, the bonding wire 75 is inserted in the opening 74 and bonded to the metal film 40. Finally the entirety is sealed with the molding resin 77 to obtain the structure shown in FIG. 22.

As described above, according to the semiconductor device and its manufacturing method of the fourth preferred embodiment, the bonding pad can be very thick by the thickness of the metal film 40 which fills the opening 30, so that the bonding wire 75 can be bonded to the bonding pad with enhanced connecting reliability and stability.

Furthermore, since the metal film 40 is formed by electroless plating, the metal film 40 can be selectively formed in the opening 30 just by immersing the object in a plating solution, which makes the manufacturing process simpler as compared with that of the third preferred embodiment.

Fifth Preferred Embodiment

Figure 25:
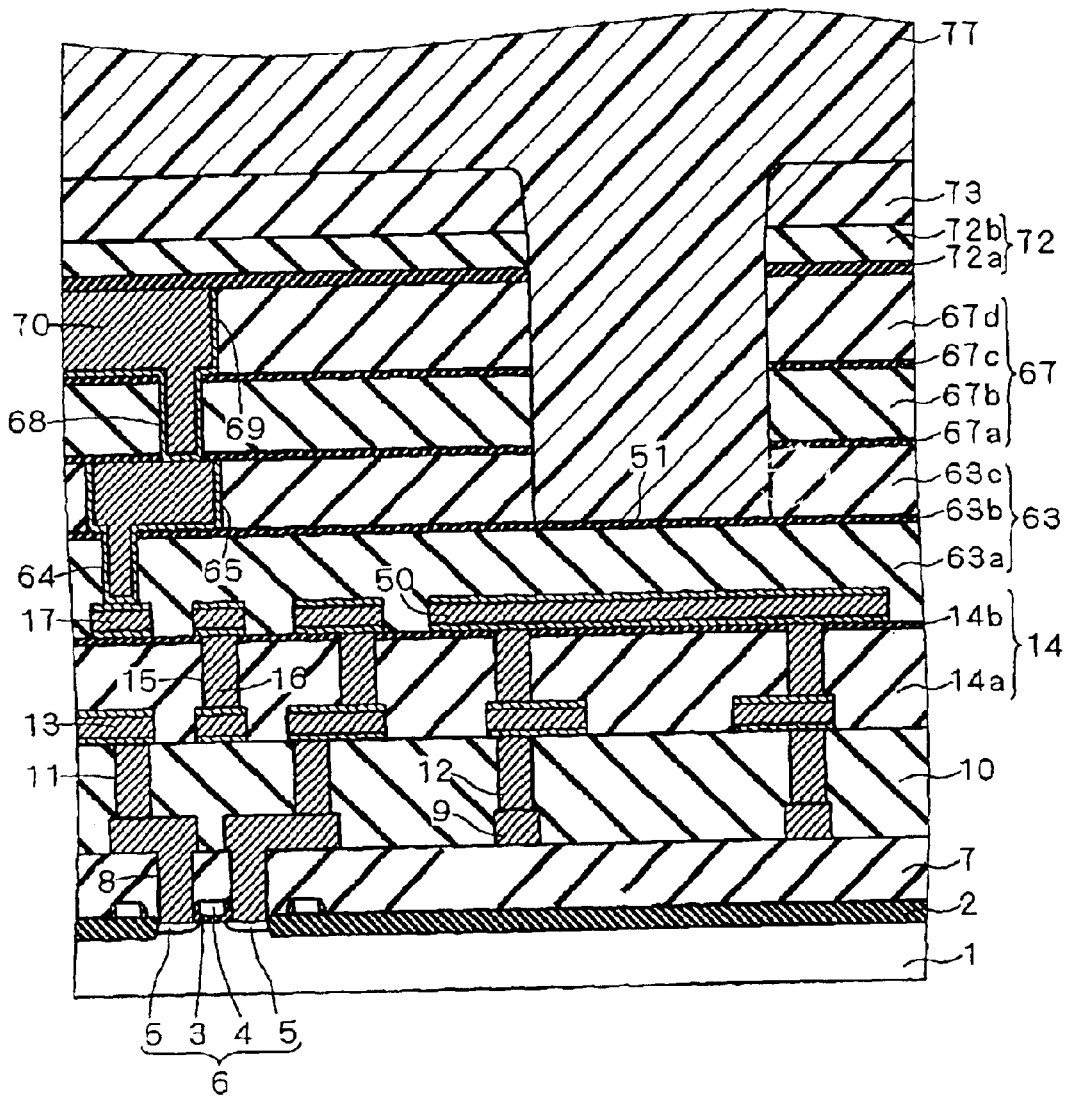
FIG. 25 is a cross-sectional view showing the structure of a semiconductor device according to a fifth preferred embodiment of the invention.
Figure 26:
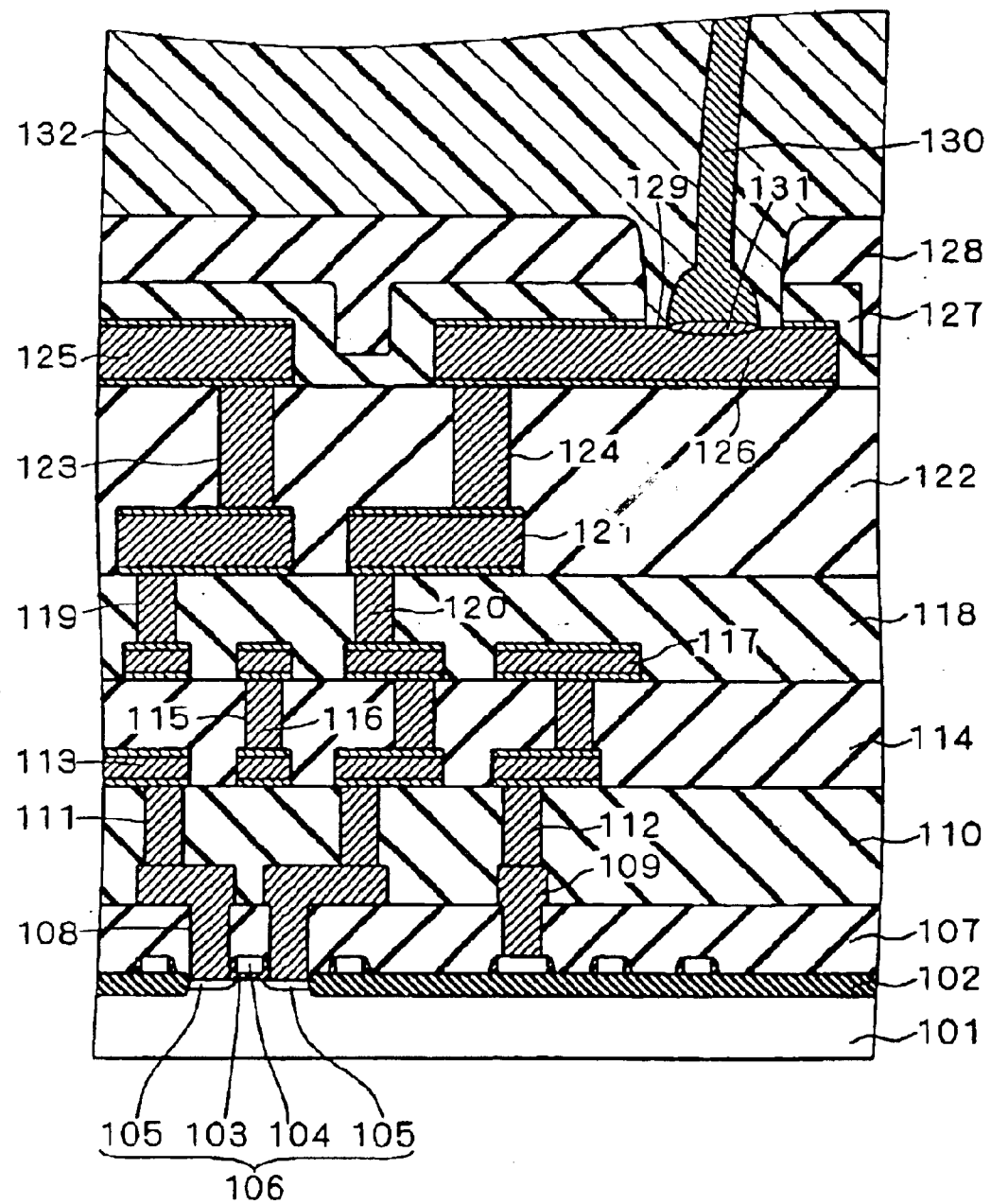
FIG. 26 is a cross-sectional view showing the structure of a conventional semiconductor device which uses aluminum interconnections.
Figure 27:
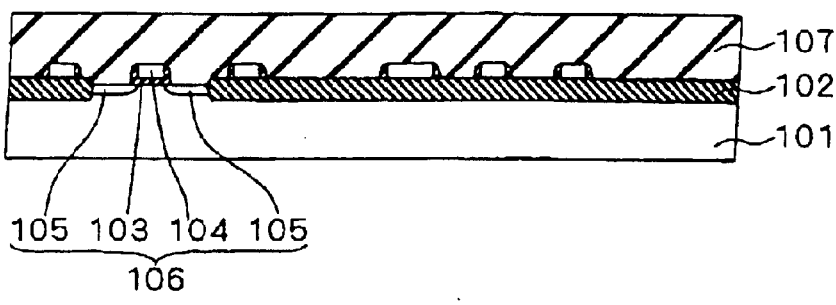
FIGS. 27 to 35 are cross-sectional views showing a sequence of process steps for manufacturing the semiconductor device shown in FIG. 26.
Figure 28:
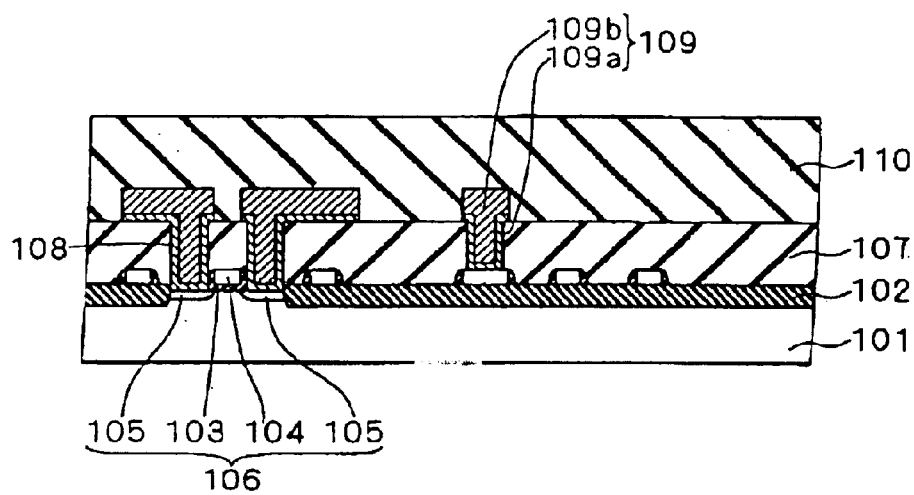
Figure 29:
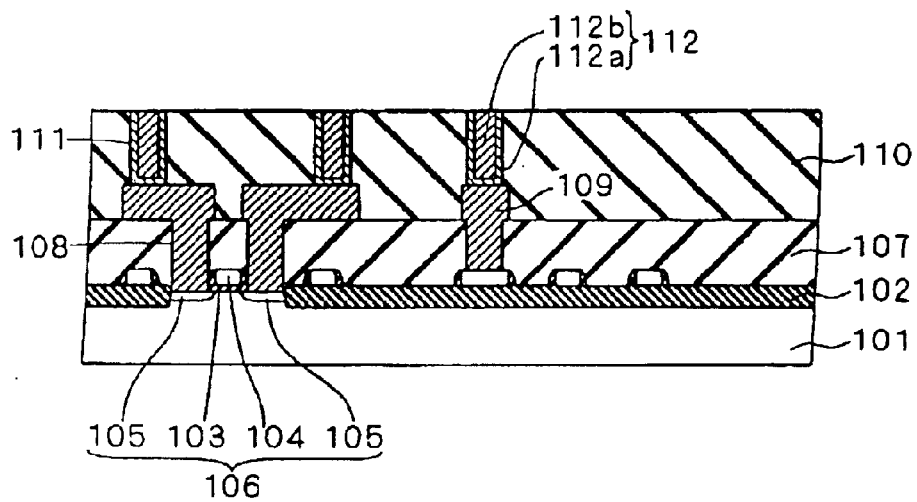
Figure 30:
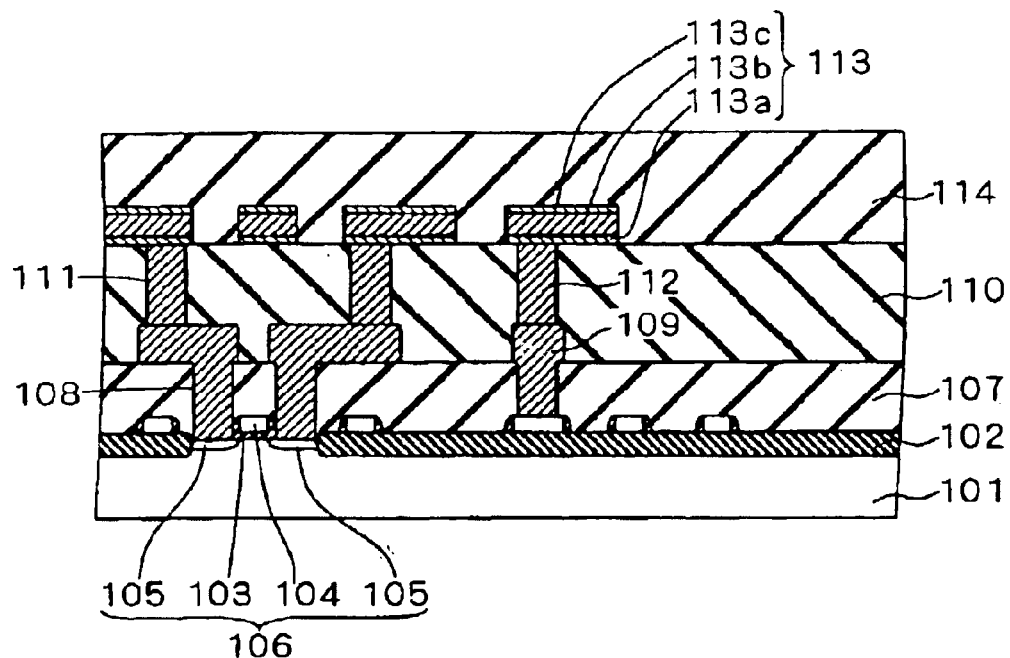
Figure 31:
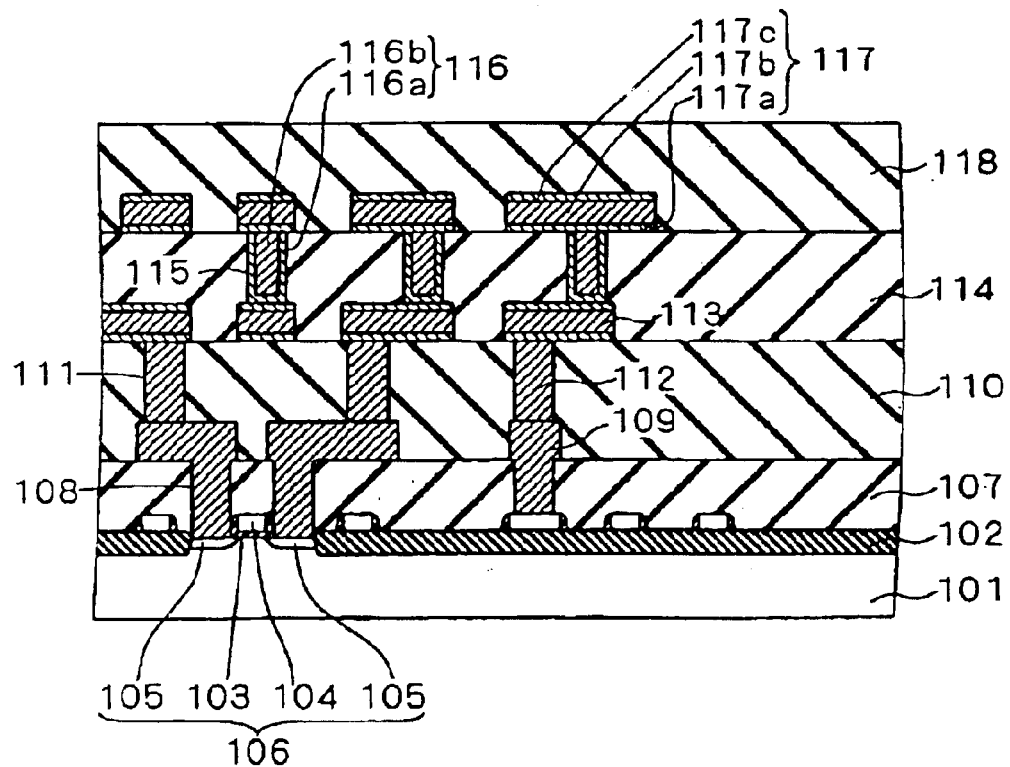
Figure 32:
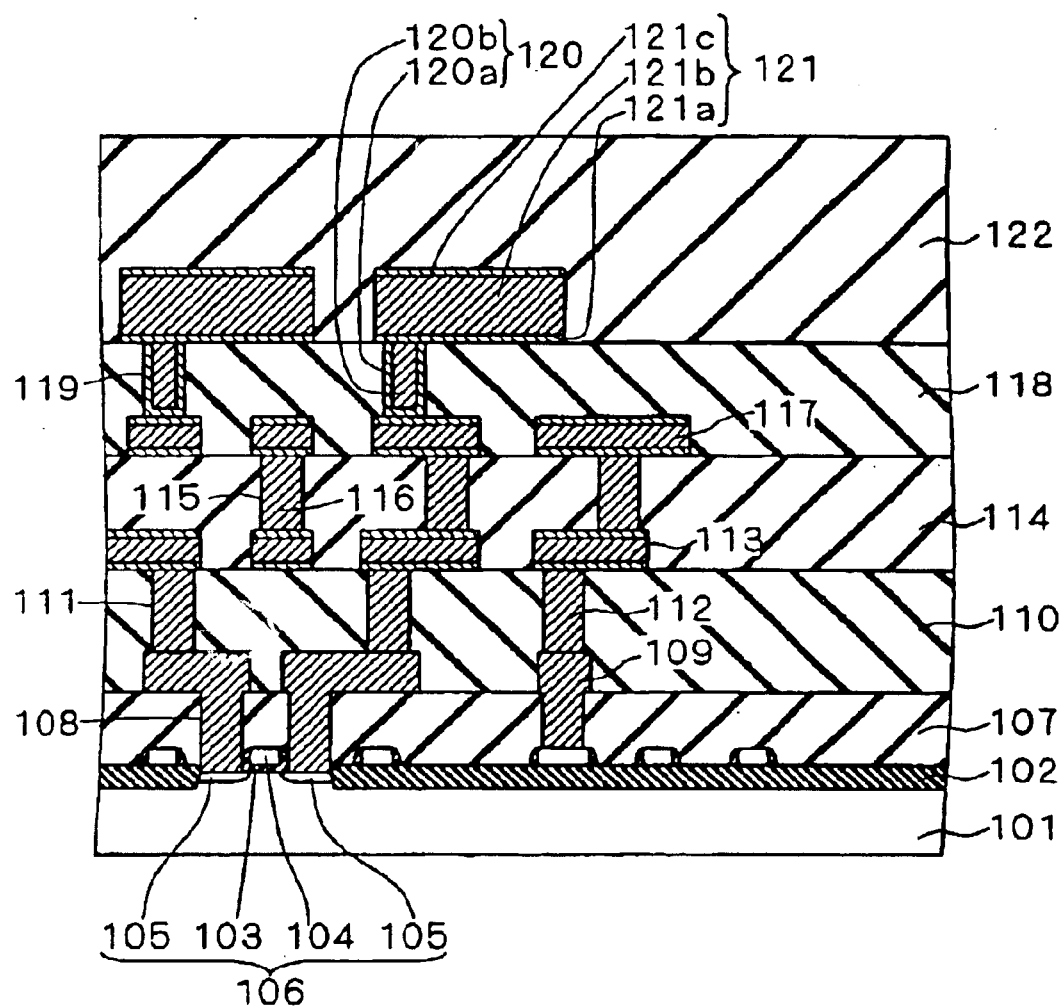
Figure 33:
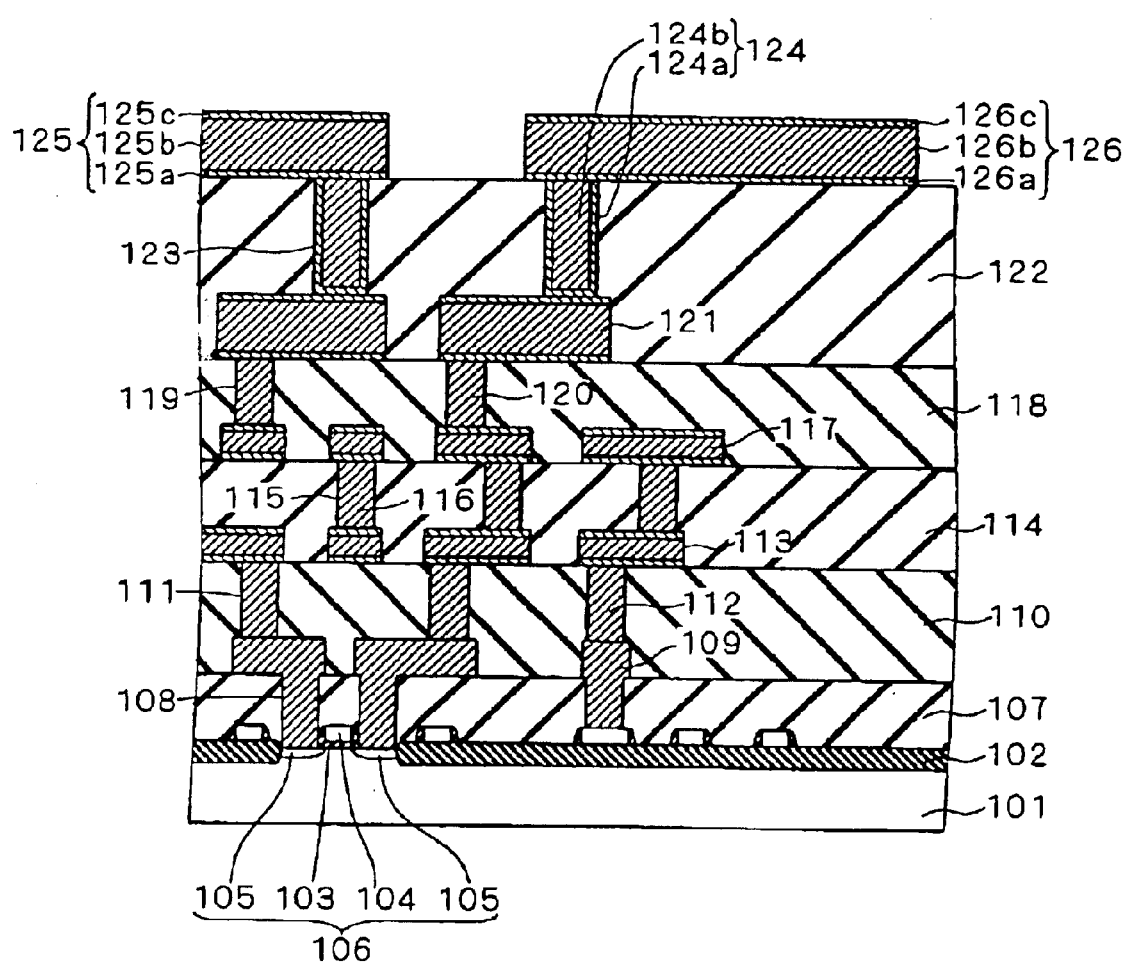
Figure 34:
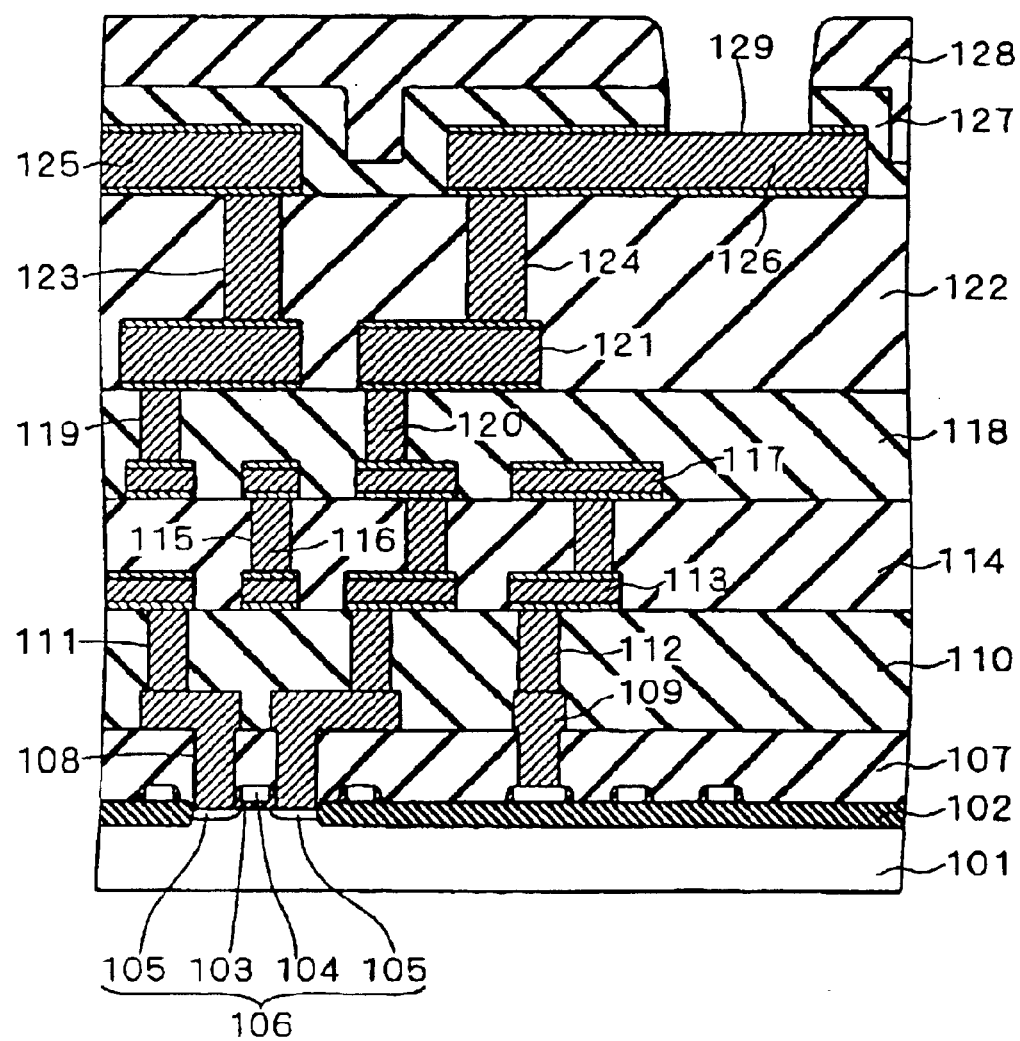
Figure 35:
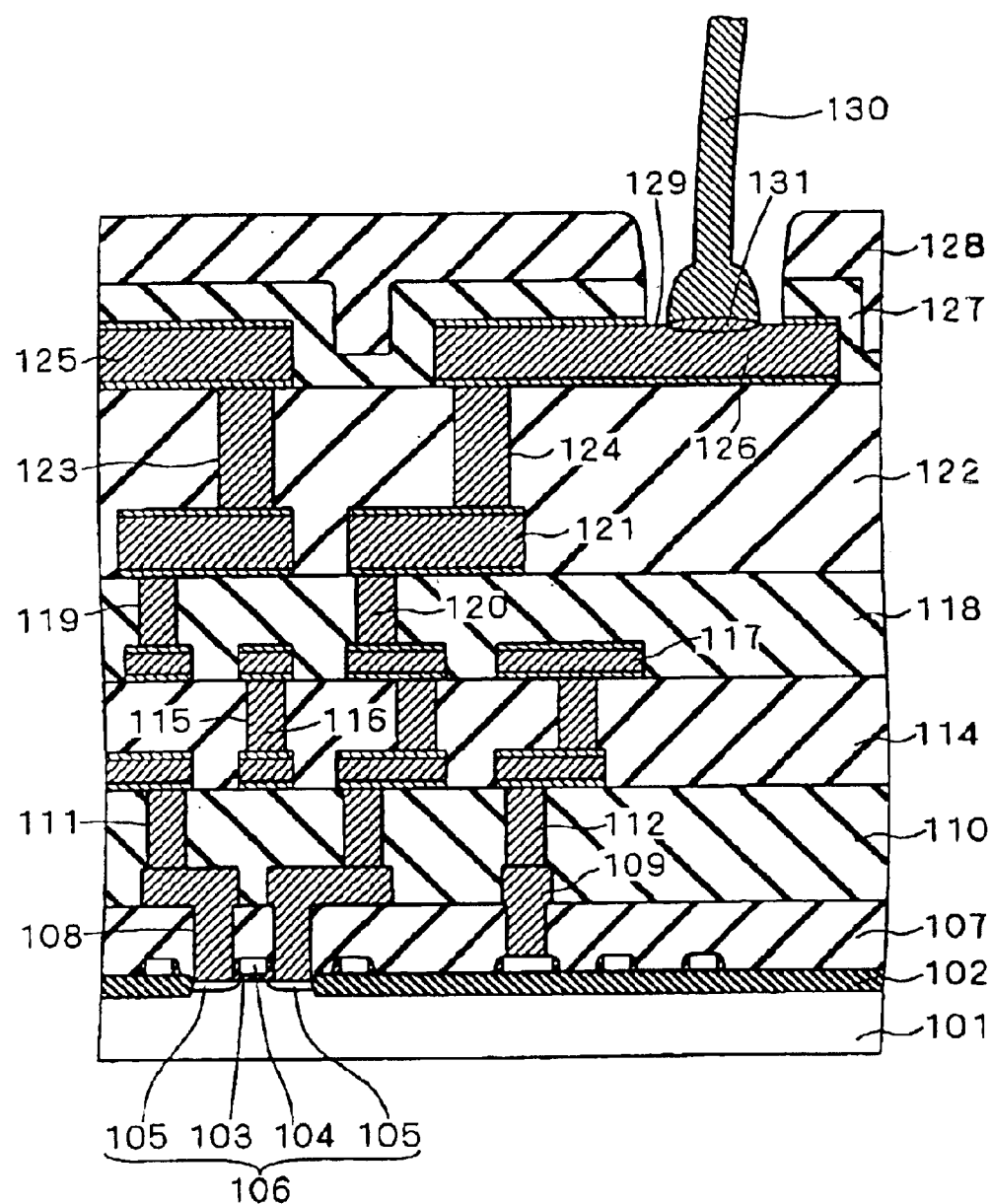
Figure 36:
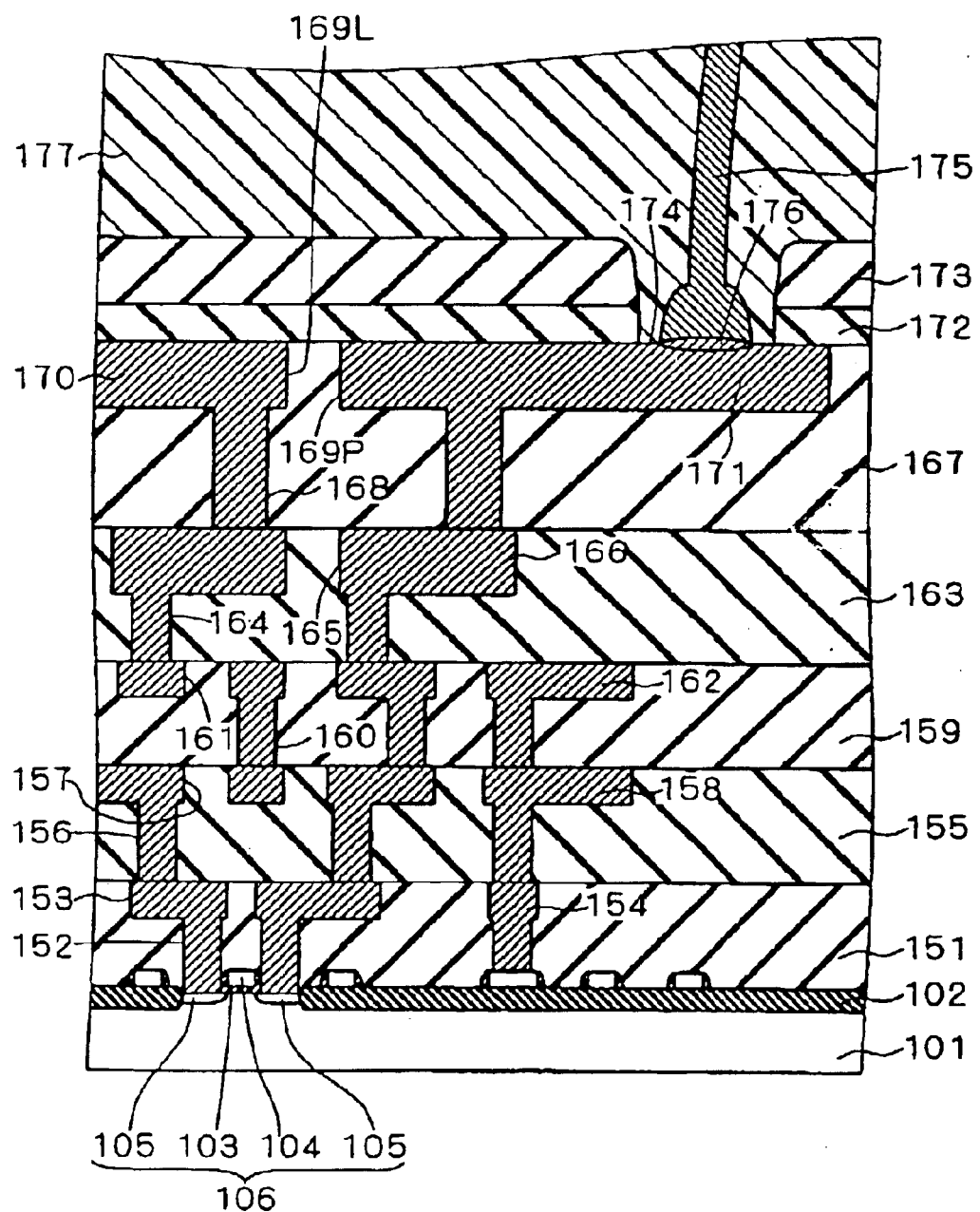
FIG. 36 is a cross-sectional view showing the structure of a conventional semiconductor device which uses copper interconnections.
Figure 37:
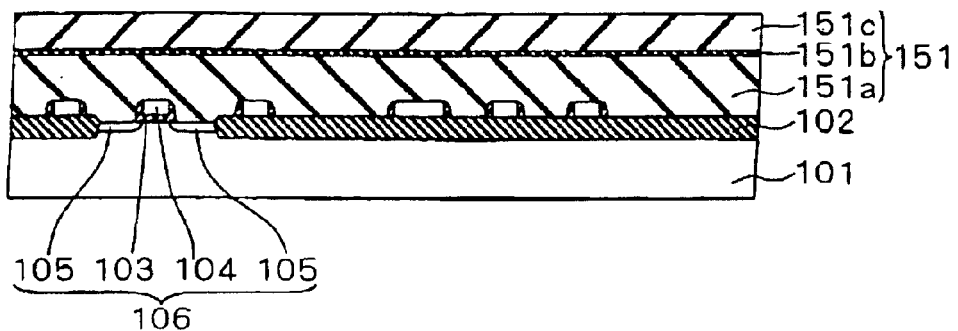
FIGS. 37 to 48 are cross-sectional views showing a sequence of process steps for manufacturing the semiconductor device shown in FIG. 36.
Figure 38:
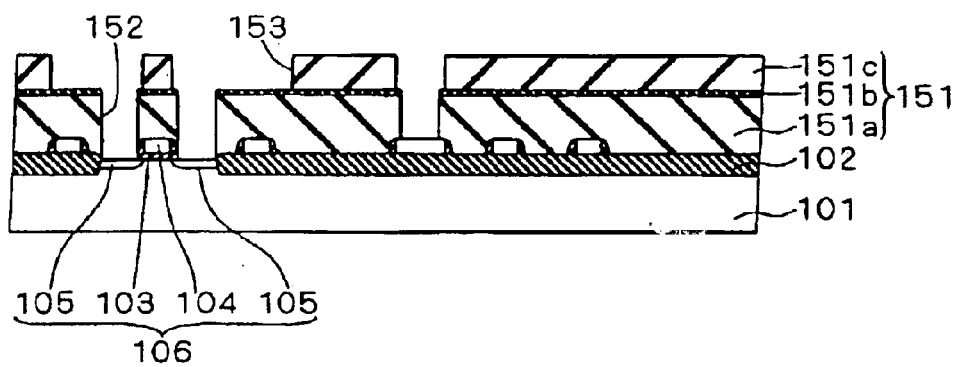
Figure 39:
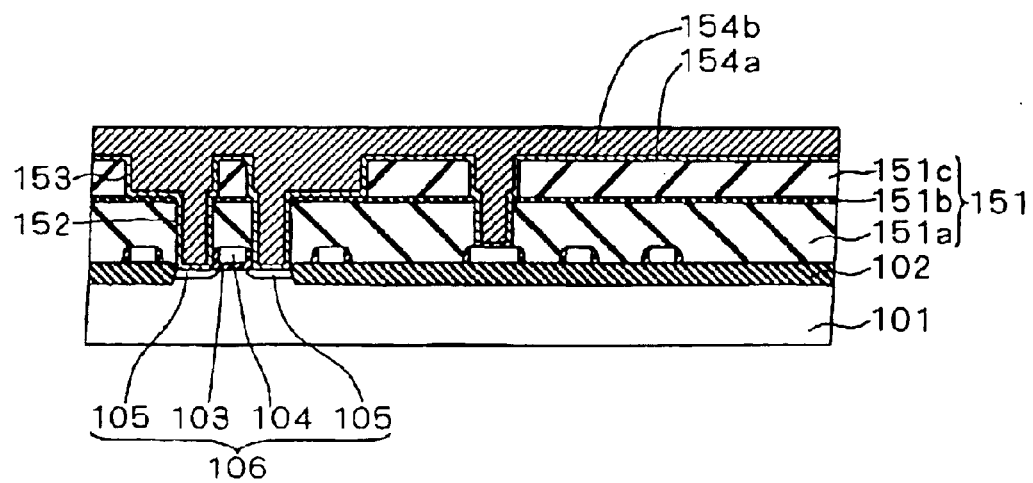
Figure 40:
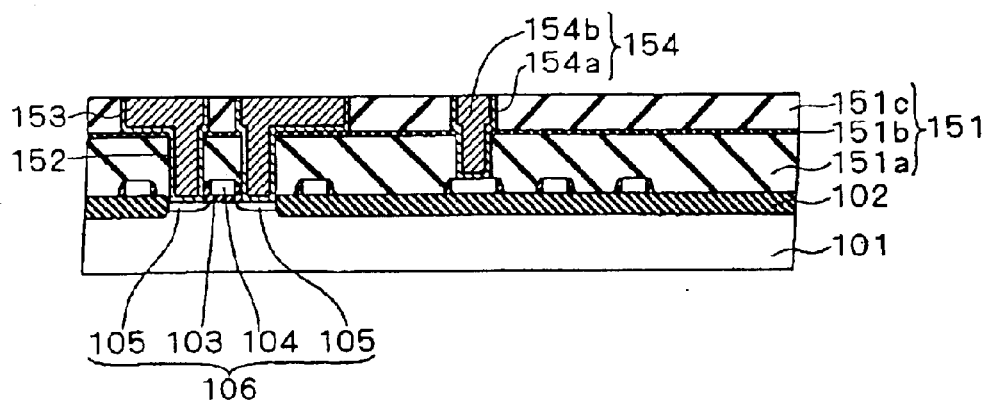
Figure 41:
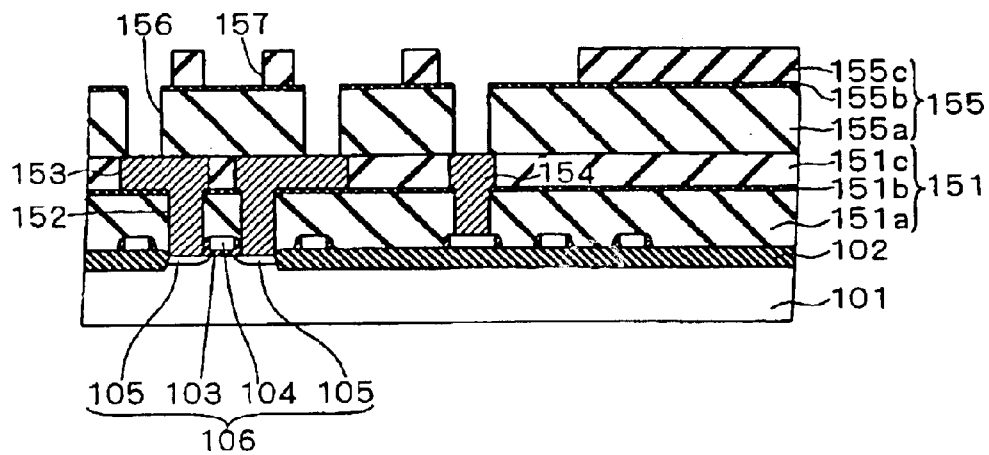
Figure 42:
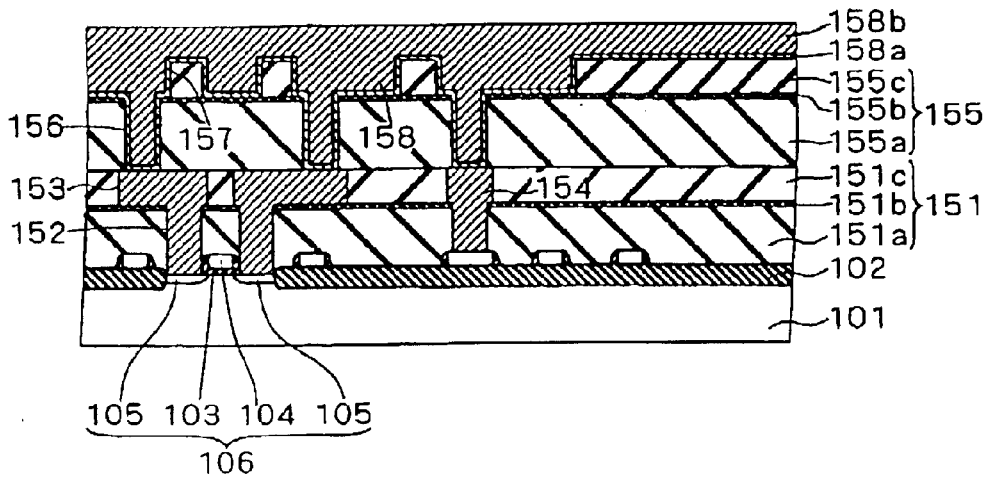
Figure 43:
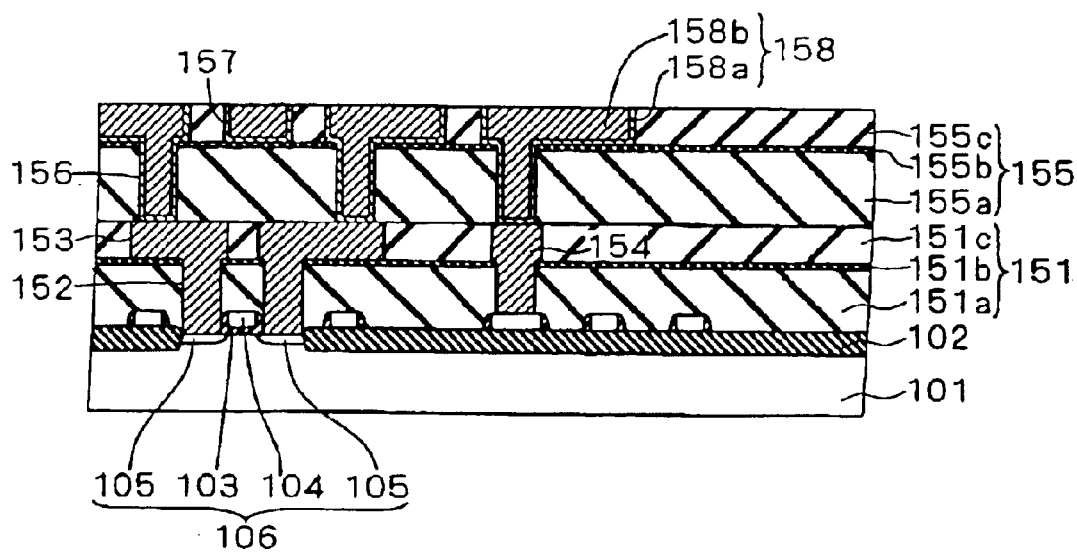
Figure 44:
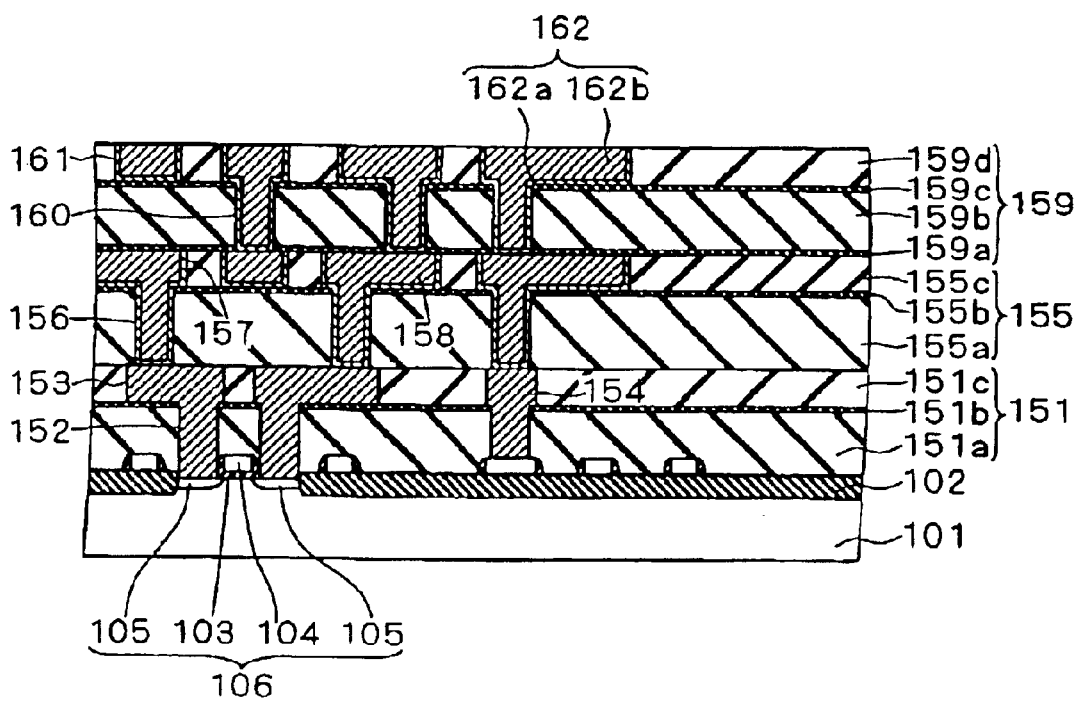
Figure 45:
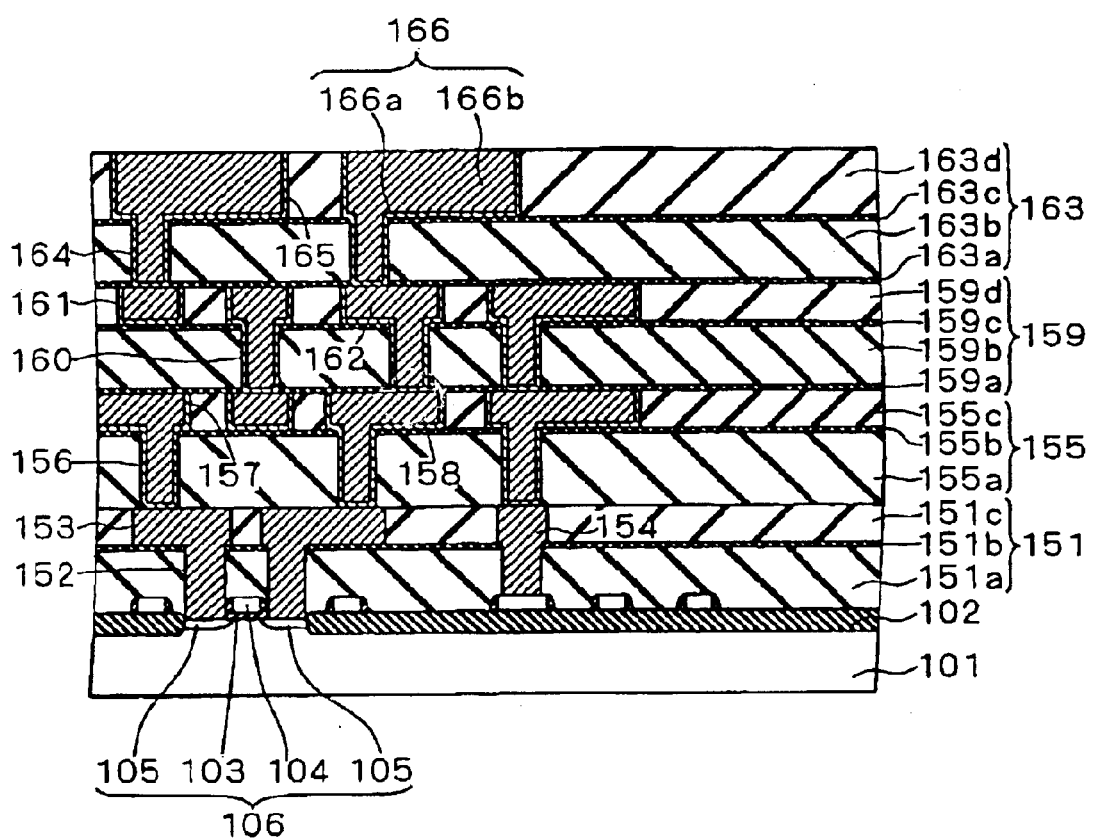
Figure 46:
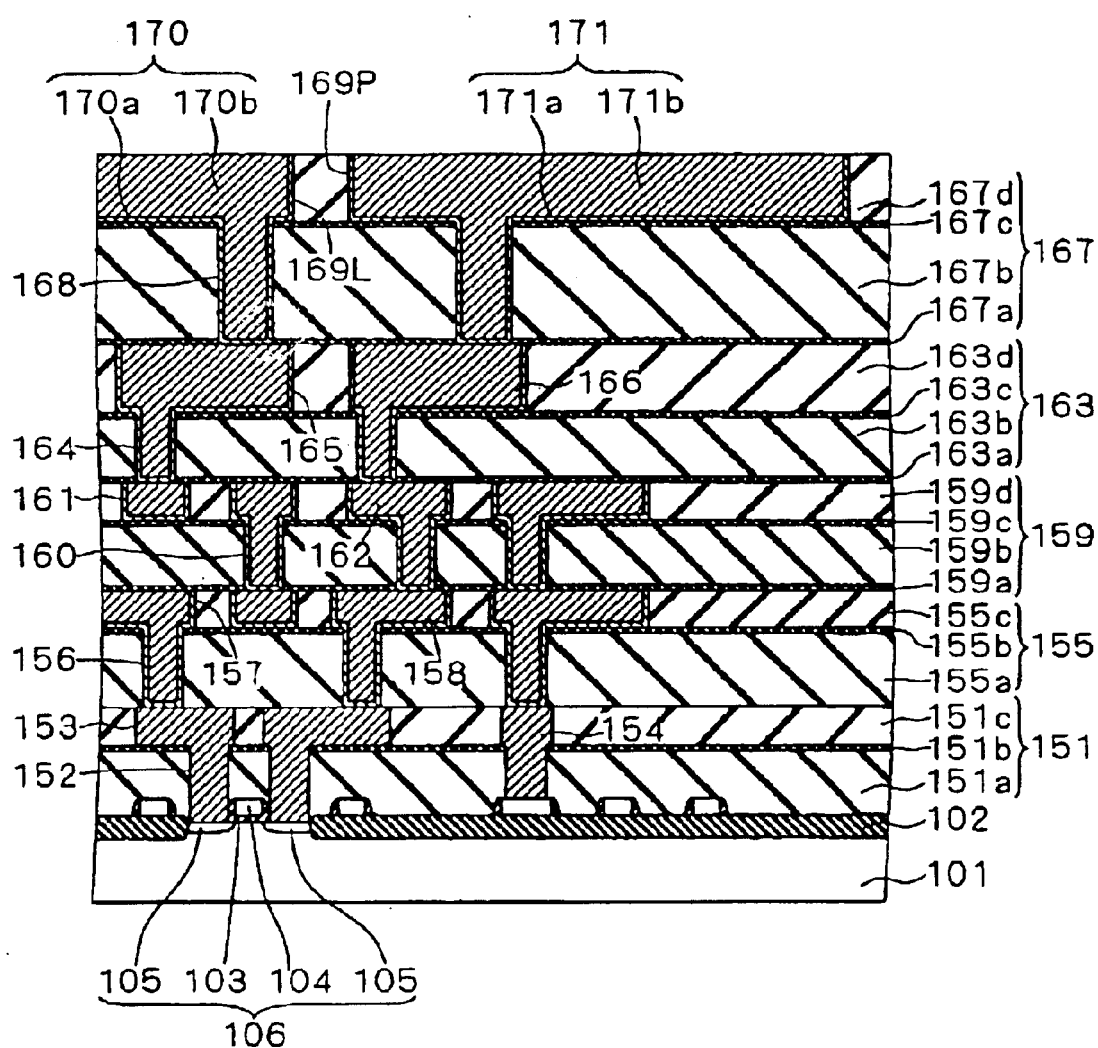
Figure 47:
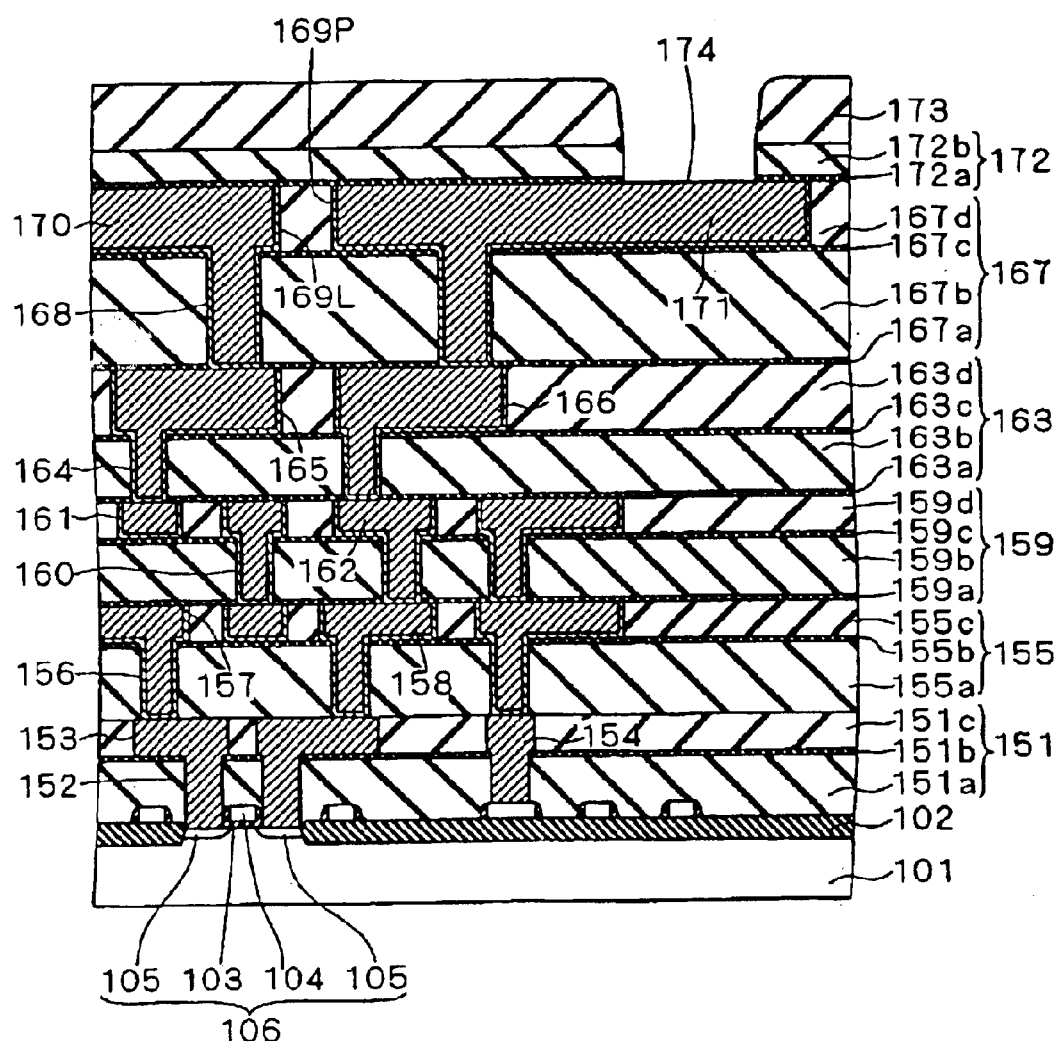
Figure 48:
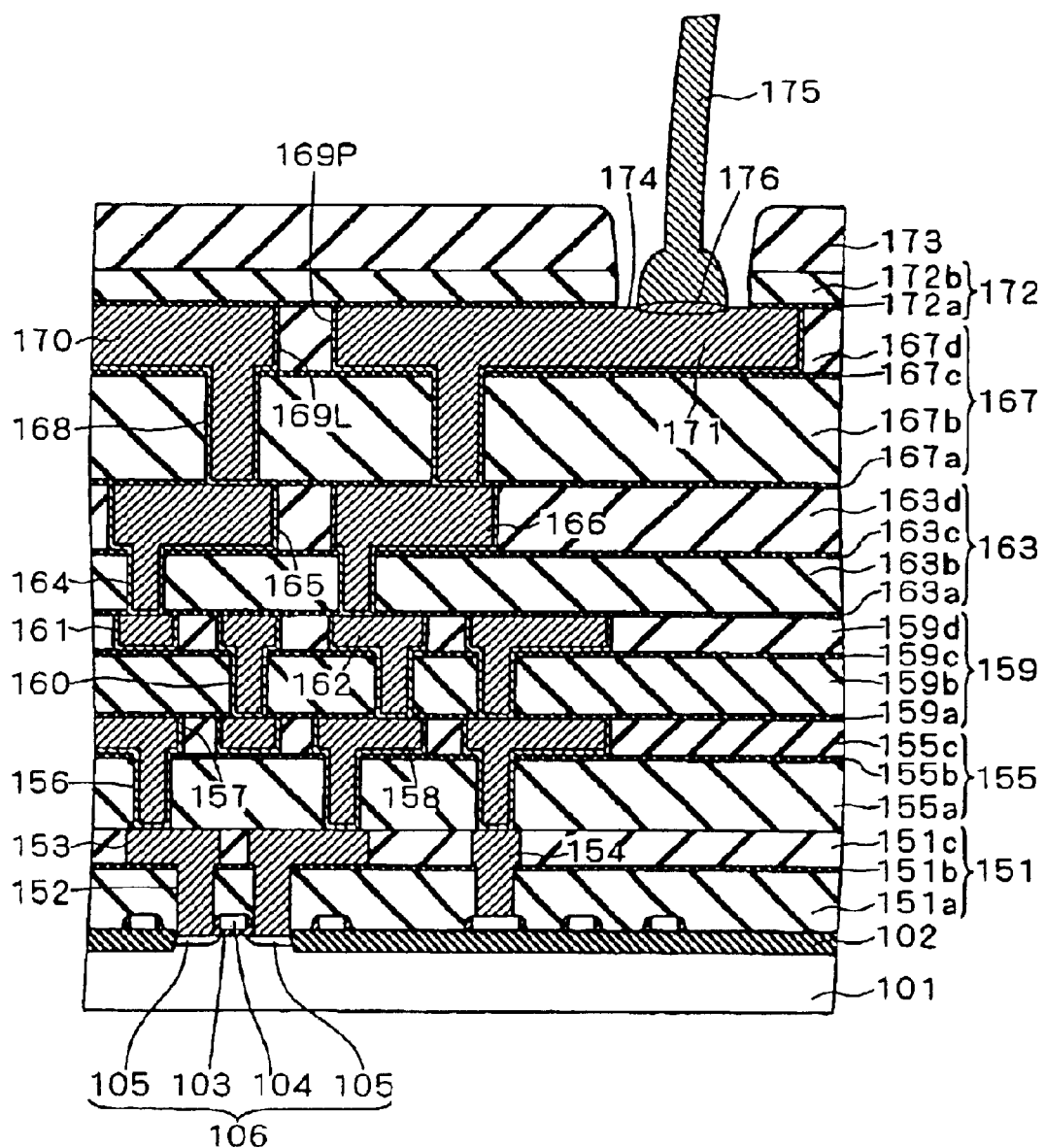
Figure 49:
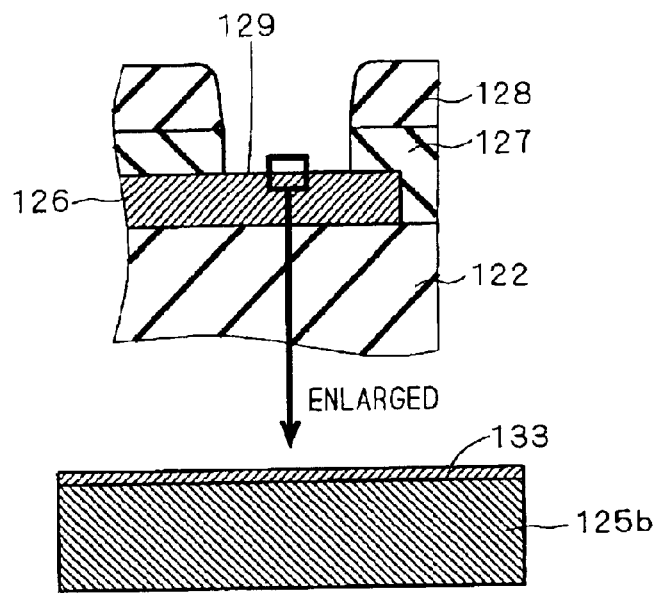
FIG. 49 is a cross-sectional view showing part of the structure shown in FIG. 34 and a part of it in an enlarged manner.
Figure 50:
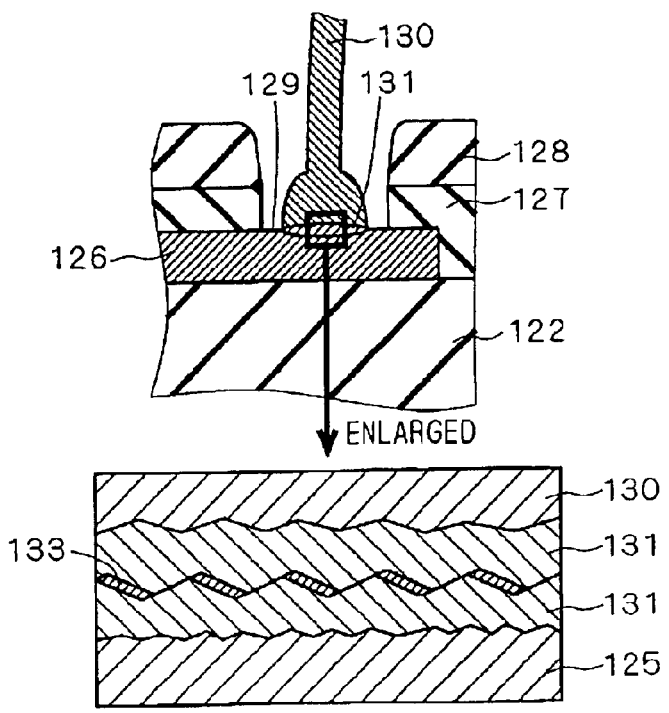
FIG. 50 is a cross-sectional view showing part of the structure shown in FIG. 35 and a part of it in an enlarged manner.
Figure 51:
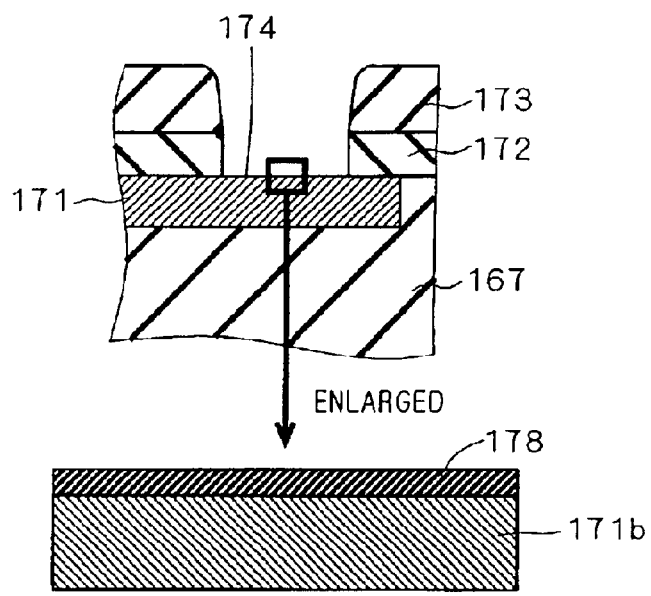
FIG. 51 is a cross-sectional view showing part of the structure shown in FIG. 47 and a part of it in an enlarged manner.
Figure 52:
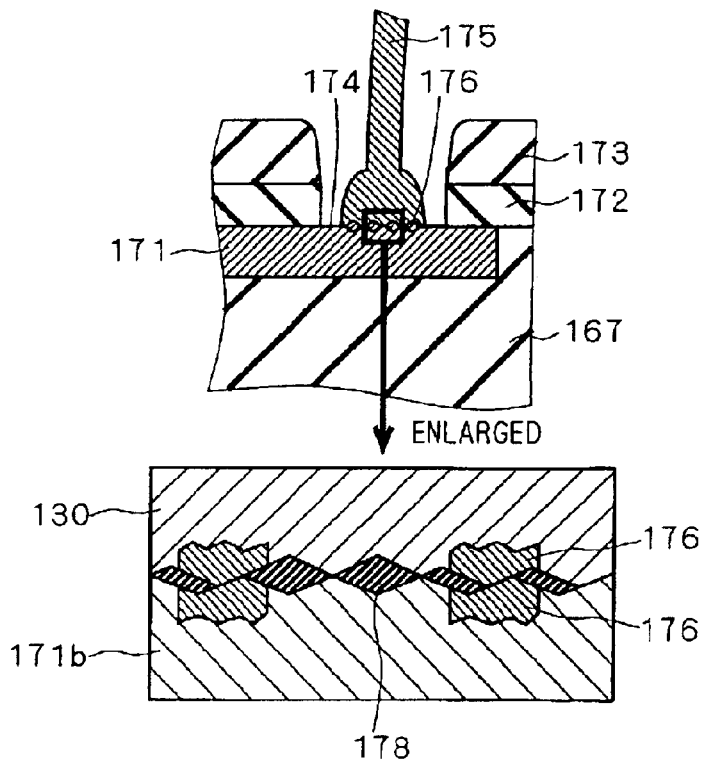
FIG. 52 is a cross-sectional view showing part of the structure shown in FIG. 48 and a part of it in an enlarged manner.

FIG. 25 is a cross-sectional view showing the structure of a semiconductor device according to a fifth preferred embodiment of the invention. The semiconductor device has a redundancy circuit; a metal film 50, which functions as a fuse of the redundancy circuit, is formed on the second interlayer insulating film 14. Like the third-layer interconnections 17, the metal film 50 has a structure in which a foundation film, e.g. a titanium film, an aluminum alloy film made of, e.g. Al—Cu, and an antireflection film, made of titanium nitride, are stacked in this order; the metal film 50 is formed by the same process as the third-layer interconnections 17. Also, the metal film 50 is connected at two portions at both its ends to the second-layer interconnections 13 through the via plugs 16. An opening 51 whose bottom is defined by the silicon nitride film 63b is formed above the metal film 50.

The opening 51 is formed by, after forming the third interlayer insulating film 63, the fourth interlayer insulating film 67, the protective insulating film 72, and, when required, the buffer coat film 73, partially removing the buffer coat film 73, the protective insulating film 72, the fourth interlayer insulating film 67, and the silicon oxide film 63c in this order by photolithography and anisotropic dry etching. The silicon nitride film 63b is used as an etching stopper during the etching of the silicon oxide film 63c. It is desirable to necessarily form the silicon nitride film 14b because the silicon nitride film 63b functioning as a copper diffusion preventing film may be lost or thinned by over etching during etching of the silicon oxide film 63c.

As described above, according to the semiconductor device and its manufacturing method of the fifth preferred embodiment, the fuse of the redundancy circuit is made not of copper having low thermal conductivity, but of an aluminum alloy having higher thermal conductivity than copper. This provides stable performance to blow the fuse.

Certainly blowing the fuse requires that the insulating films (the silicon oxide films 14a and 63a) above and under the fuse be uniform in film thickness. When they are not uniform in thickness, energy nonuniformity occurs to cause abnormal blowing. In the semiconductor device and manufacturing method of the fifth preferred embodiment, the fuse is formed in a lower interconnection layer below the uppermost layer, so that variations in film thickness of the insulating films above and under the fuse can be made smaller than when the fuse is formed in the uppermost interconnection layer. As a result the blowing performance can be more stable.

While the first to fifth preferred embodiments have described examples of multilayer interconnection structure having two aluminum interconnection layers (the second and third interconnection layers) and two copper interconnection layers (the fourth and fifth interconnection layers), the present invention is, needless to say, applicable to semiconductor devices having multilayer interconnection structure with at least one aluminum interconnection layer and at least one copper interconnection layer.

While the invention has been described in detail, the foregoing description is in all aspects illustrative and not restrictive. It is understood that numerous other modifications and variations can be devised without departing from the scope of the invention.

What is claimed is:

1. A semiconductor device comprising a multilayer interconnection structure in which a plurality of interconnection layers are formed in an insulating film,
   said multilayer interconnection structure having,
   a first metal film made of a first material and functioning as a first interconnection belonging to an interconnection layer other than an uppermost interconnection layer,
   a second metal film made of a second material and functioning as a second interconnection belonging to the uppermost interconnection layer, said second material having a lower resistance and being more susceptible to oxidation than said first material, and
   a third metal film made of said first material, belonging to an interconnection layer other than the uppermost interconnection layer, and functioning as a bonding pad,
   said semiconductor device further comprising,
   an opening formed in said insulating film and having its bottom defined by said third metal film, and
   a bonding wire connected to said third metal film through said opening.

2. The semiconductor device according to claim 1, wherein said first material is an aluminum alloy and said second material is copper.

3. The semiconductor device according to claim 1, wherein said third metal film comprises a plurality of metal films belonging to a plurality of interconnection layers other than the uppermost interconnection layer.

4. The semiconductor device according to claim 3, wherein said plurality of metal films are connected to each other through a plurality of strip-like via plugs formed between said plurality of metal films.

5. The semiconductor device according to claim 3, wherein said plurality of metal films are connected to each other through a plurality of dot-like via plugs formed between said plurality of metal films.

6. The semiconductor device according to claim 1, further comprising a fourth metal film formed on said third metal film in said opening and functioning as part of said bonding pad, wherein said bonding wire is bonded to said fourth metal film.

7. The semiconductor device according to claim 6, wherein said fourth metal film fills said opening.

8. A semiconductor device comprising a multilayer interconnection structure in which a plurality of interconnection layers are formed in an insulating film, said multilayer interconnection structure having, a first metal film made of a first material and functioning as a first interconnection belonging to an interconnection layer other than an uppermost interconnection layer, a second metal film made of a second material and functioning as a second interconnection belonging to the uppermost interconnection layer, said second material having a lower resistance and a lower thermal conductivity than said first material, and a third metal film made of said first material, belonging to an interconnection layer other than the uppermost interconnection layer, and functioning as a fuse of a redundancy circuit, and said semiconductor device further comprising an opening formed in said insulating film and having its bottom defined above said third metal film.

* * * * *